(12) United States Patent  
Walter

(10) Patent No.: US 8,847,222 B2  
(45) Date of Patent: Sep. 30, 2014

(54) SEMICONDUCTOR DEVICE TEST STRUCTURES AND METHODS

(75) Inventor: Wolfgang Walter, Kaufbeuren (DE)

(73) Assignee: Infineon Technologies AG, Neubiberg (DE)

(*) Notice: Subject to any disclaimer, the term of this patent is extended or adjusted under 35 U.S.C. 154(b) by 475 days.

(21) Appl. No.: 12/914,539

(22) Filed: Oct. 28, 2010

(65) Prior Publication Data

US 2011/0042671 A1   Feb. 24, 2011

Related U.S. Application Data

(62) Division of application No. 11/710,086, filed on Feb. 23, 2007, now Pat. No. 7,851,237.

(51) Int. Cl.

| | | |
|---|---|---|
| *H01L 23/58* | (2006.01) | |
| *H01L 29/10* | (2006.01) | |
| *H01L 21/66* | (2006.01) | |
| *G01R 31/26* | (2014.01) | |
| *G01R 31/28* | (2006.01) | |

(52) U.S. Cl.
CPC ........ *G01R 31/2831* (2013.01); *G01R 31/2642* (2013.01); *G01R 31/2879* (2013.01); *G01R 31/2858* (2013.01); *H01L 22/34* (2013.01)
USPC ...................................... 257/48; 257/E23.08

(58) Field of Classification Search
USPC ............ 257/48, E23.179, 108, 225, 252, 467, 257/470, E23.08, E23.081, E23.082; 136/200–201
See application file for complete search history.

(56) References Cited

U.S. PATENT DOCUMENTS

| | | |
|---|---|---|
| 5,229,327 A | 7/1993 | Farnworth |
| 5,430,322 A | 7/1995 | Koyanagi et al. |
| 5,497,076 A * | 3/1996 | Kuo et al. ................ 324/762.02 |
| 5,625,232 A | 4/1997 | Numata et al. |
| 5,625,288 A | 4/1997 | Snyder et al. |
| 5,675,187 A | 10/1997 | Numata et al. |
| 5,811,352 A | 9/1998 | Numata et al. |
| 5,900,735 A | 5/1999 | Yamamoto |
| 6,082,115 A | 7/2000 | Strnad |

(Continued)

FOREIGN PATENT DOCUMENTS

| | | |
|---|---|---|
| DE | 197 10 471 A1 | 5/1998 |
| JP | 2000174085 A | 6/2000 |

(Continued)

OTHER PUBLICATIONS

Chiang, T.-Y., et al., "Analytical Thermal Model for Multilevel VLSI Interconnects Incorporating Via Effect," IEEE Electron Device Letters, Jan. 2002, pp. 31-33, vol. 23, No. 1, IEEE, Los Alamitos, CA.

(Continued)

*Primary Examiner* — Daniel Luke
*Assistant Examiner* — Latanya N Crawford
(74) *Attorney, Agent, or Firm* — Slater & Matsil, L.L.P.

(57) ABSTRACT

Semiconductor device test structures and methods are disclosed. In a preferred embodiment, a test structure includes a feed line, a stress line disposed proximate the feed line, and a conductive feature disposed between the stress line and the feed line. The test structure includes a temperature adjuster proximate at least the conductive feature, and at least one feedback device coupled to the temperature adjuster and at least the conductive feature.

34 Claims, 11 Drawing Sheets

(56) References Cited

U.S. PATENT DOCUMENTS

| | | | |
|---|---|---|---|
| 6,282,679 B1 | 8/2001 | Lee | |
| 6,320,391 B1 * | 11/2001 | Bui | 324/537 |
| 6,387,742 B2 | 5/2002 | Gauthier, Jr. et al. | |
| 6,476,483 B1 | 11/2002 | Adler et al. | |
| 6,476,508 B1 | 11/2002 | Strnad | |
| 6,588,217 B2 | 7/2003 | Ghoshal | |
| 6,598,182 B1 | 7/2003 | Lowitz et al. | |
| 6,603,321 B2 | 8/2003 | Filippi, Jr. et al. | |
| 6,680,484 B1 | 1/2004 | Young | |
| 6,762,597 B1 * | 7/2004 | Hau-Riege et al. | 324/71.1 |
| 6,770,847 B2 * | 8/2004 | Yao et al. | 219/209 |
| 6,774,450 B2 | 8/2004 | Inbe | |
| 6,784,000 B2 | 8/2004 | Sikora et al. | |
| 6,819,124 B1 | 11/2004 | Allee et al. | |
| 6,822,437 B1 | 11/2004 | Hau-Riege et al. | |
| 6,822,473 B1 | 11/2004 | Hau-Riege et al. | |
| 6,919,639 B2 | 7/2005 | Ho et al. | |
| 6,940,720 B2 | 9/2005 | Fischer et al. | |
| 6,995,392 B2 | 2/2006 | McLaughlin et al. | |
| 7,096,450 B2 | 8/2006 | Gill et al. | |
| 7,146,588 B1 * | 12/2006 | Marathe et al. | 716/136 |
| 7,300,821 B2 | 11/2007 | Farrar et al. | |
| 7,391,092 B2 | 6/2008 | Ohkubo et al. | |
| 7,679,203 B2 | 3/2010 | Bharathan et al. | |
| 7,804,291 B2 * | 9/2010 | Kang et al. | 324/750.3 |
| 7,858,406 B2 * | 12/2010 | Walter et al. | 438/18 |
| 2002/0121094 A1 | 9/2002 | VanHoudt | |
| 2004/0000333 A1 | 1/2004 | Chen et al. | |
| 2004/0036495 A1 | 2/2004 | Fazekas et al. | |
| 2004/0262031 A1 * | 12/2004 | Gill et al. | 174/252 |
| 2005/0211980 A1 * | 9/2005 | Fischer et al. | 257/48 |
| 2005/0218470 A1 | 10/2005 | Ohkubo et al. | |
| 2005/0218471 A1 * | 10/2005 | Ohkubo et al. | 257/467 |
| 2006/0192584 A1 * | 8/2006 | Kang et al. | 324/765 |
| 2006/0220012 A1 | 10/2006 | Wu et al. | |
| 2007/0235708 A1 | 10/2007 | Elmegreen et al. | |
| 2007/0278484 A1 | 12/2007 | Feustel et al. | |
| 2008/0185584 A1 | 8/2008 | Walter et al. | |
| 2009/0058434 A1 * | 3/2009 | Lin et al. | 324/719 |

FOREIGN PATENT DOCUMENTS

| | | |
|---|---|---|
| JP | 2000-223489 | 8/2000 |
| KR | 20030050651 A1 | 6/2003 |
| TW | 432217 | 5/2001 |
| TW | 200300055 | 5/2003 |
| WO | WO 03038459 A1 | 5/2003 |

OTHER PUBLICATIONS

"Electromigration," Wikipedia, the Free Encyclopedia, http://en.wikipedia.org/wiki/Electromigration, downloaded Jan. 5, 2007, 11 pp., Wikimedia Foundation Inc., St. Petersburg, FL.

Glasow, A.v., et al., "Using the Temperature Coefficient of the Resistance (TCR) as Early Reliability Indicator for Stressvoiding Risks in Cu Interconnects," 2003 International Reliability Physics Symposium, Apr. 1, 2003, 6 pages, IEEE, Dallas, TX.

Noll, S.J., "Peltier Device Information Directory," http://www.peltier-info.com/info.html, downloaded Feb. 13, 2007, 5 pp., Thermoelectric Design LLC, Traverse City, MI.

Schindler, G., et al., "Recent Advances for Nano Interconnects: Conductor Reliability and Resistivity," Proceedings of the Advanced Metallization Conference (AMC) 2002, 7 pp.

* cited by examiner

SEMICONDUCTOR DEVICE TEST STRUCTURES AND METHODS

This application is a divisional of patent application Ser. No. 11/710,086, filed on Feb. 23, 2007 now U.S. Pat. No. 7,851,237, which application is incorporated herein by reference in its entirety.

CROSS-REFERENCE TO RELATED APPLICATIONS

This application relates to the following co-pending and commonly assigned patent application: Ser. No. 11/702,975, filed on Feb. 6, 2007, entitled, "Semiconductor Device Test Structures and Methods," which application is hereby incorporated herein by reference.

TECHNICAL FIELD

The present invention relates generally to the fabrication of semiconductor devices, and more particularly to test structures and methods for semiconductor devices.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

Semiconductor devices typically include one or more metallization layers that are usually formed in the upper material layers of the semiconductor devices in a back end of the line (BEOL) of the fabrication process. The metallization layers include conductive lines comprised of conductive materials such as aluminum (Al), copper (Cu), and other metals, which are separated from other conductive lines by an insulating material such as silicon dioxide ($SiO_2$).

Electromigration is a phenomenon that occurs in conductive materials that can cause problems in semiconductor devices having small conductive features. Electromigration is the transport of material caused by the gradual movement of atoms in a conductive material, due to a momentum transfer between conducting electrons and diffusing metal atoms. Electromigration occurs when electrons transfer momentum to atoms, which causes the atoms to move from their original positions.

Over time, the movement of atoms from their original positions due to electromigration can cause a break or gap in the conductive material, preventing or hindering the flow of electrical current. In narrow interconnect conductors, such as conductive lines linking transistors and other components in integrated circuits, this is known as a void or internal failure open circuit. Electromigration can also cause the atoms of a conductor to pile up and drift toward other nearby conductors, creating an unintended electrical connection known as a hillock or whisker failure, or a short circuit. Both voids and hillock failures can lead to a malfunction of an integrated circuit.

Electromigration is particularly a problem in applications where high direct current densities are used. With increasing miniaturization, the probability of failure due to electromigration increases in semiconductor devices, because smaller conductive lines have increased power density and current density. Electromigration can lead to the eventual loss of one or more connections, and to the intermittent failure and/or eventually permanent failure of an entire circuit.

Electromigration is an inherent limitation for very large scale integration (VLSI) interconnect systems, because electromigration reliability issues limit current density increase in ever-shrinking VLSI circuitry. Electromigration performance testing is consequently a very important factor during the development of technology and also in the manufacturing process of semiconductor devices.

One key cost issue facing semiconductor device designers is the acceleration of electromigration testing times, which currently may range from several hours to several days, for example. Temperature and current density are two factors involved in the acceleration of electromigration testing times. Both factors are limited: increased temperature can initiate other non-electromigration degradation mechanisms, while increased current density tends to cause temperature inhomogeneities in test structures, deteriorating or inhibiting the electromigration assessment. Temperature inhomogeneities are especially pronounced in test structures involving both conductive lines and vias or contacts, for example. Via and contact issues may be independent from conductive line issues and have become critical issues for Cu and AlCu interconnect systems, for example.

Thus, what are needed in the art are improved structures and methods for testing electromigration and electromigration-related parameters in semiconductor devices.

SUMMARY OF THE INVENTION

These and other problems are generally solved or circumvented, and technical advantages are generally achieved, by preferred embodiments of the present invention, which provide improved structures and methods for testing and measuring electromigration and electromigration-related parameters in semiconductor devices.

In accordance with a preferred embodiment of the present invention, a test structure includes a feed line, a stress line disposed proximate the feed line, and a conductive feature disposed between the stress line and the feed line. The test structure includes a temperature adjuster proximate at least the conductive feature and at least one feedback device coupled to the temperature adjuster and at least the conductive feature.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
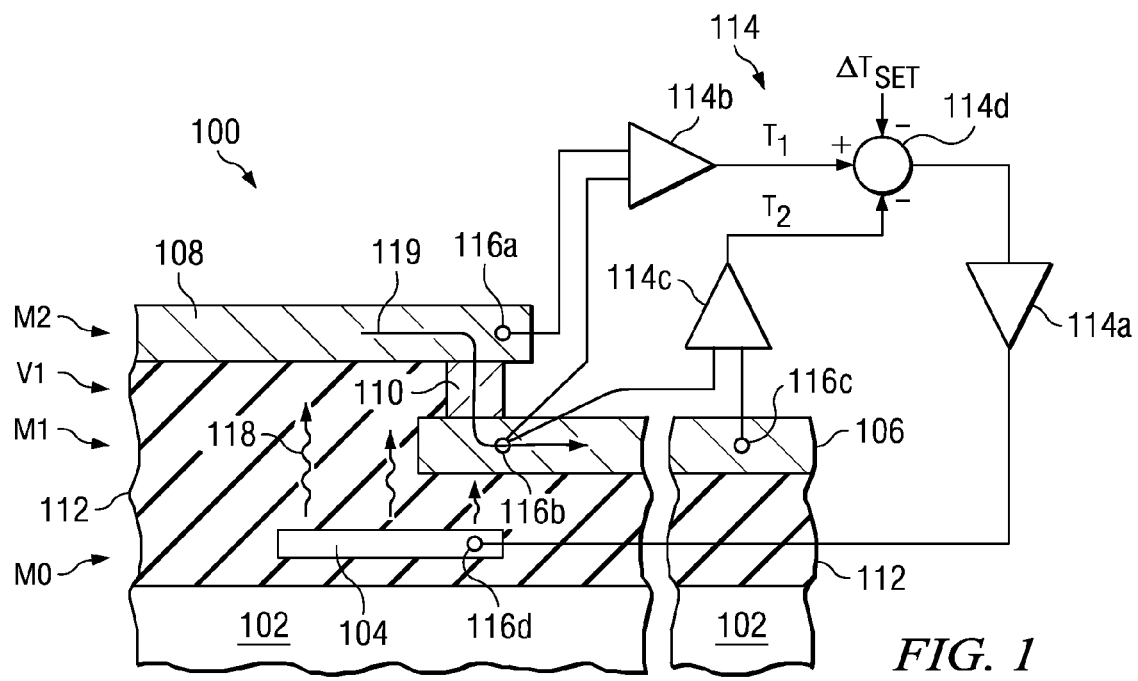
FIG. 1 is a cross-sectional view of a test structure of a semiconductor device in accordance with a preferred embodiment of the present invention that includes a temperature adjuster and a feedback loop for achieving temperature uniformity in the test structure.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Conventional via-line test structures for measuring electromigration typically comprise a feed line for supplying current and a stress line that is used for making measurements of electromigration. The stress line is formed in a different conductive material layer than the feed line, and the feed line is connected to the stress line for the electromigration measurements by one or more vias disposed between the two conductive material layers. In order to accelerate the test time of such conventional test structures, the test current is often increased. However, increasing the amount of current causes Joule's heating, which tends to be non-uniform along the length of the test structure. The variation in size of the stress line, the feed line, and the via, which may originate from unintended process variations in dielectric layer and conductive material thicknesses and widths, can create or change temperature inhomogeneities in an electromigration test structure.

For example, the temperature of the via connecting the stress line and the feed line can be higher or lower than in the stress line. The temperature of the via may not be predictable to due typical manufacturing process variations. The via between the stress line and the feed line is smaller in cross-section than the stress line and feed line, and has a higher resistivity than the feed line and stress line, resulting in hot spots at the via site. Furthermore, the temperature of the feed line is typically significantly less than the temperature of the stress line, e.g., about 50% less in some conventional test structures. The decreased temperature of the feed line in comparison to the stress line may be caused by a greater width of the feed line, closer proximity of the feed line to the substrate, or process variations in the manufacture of the two conductive material layers of the test structure that the feed line and stress line are formed in, for example.

The inhomogeneous temperature profile of such conventional electromigration test structures can hide or pronounce via failures and can inhibit a quantitative electromigration assessment of a semiconductor device. Thus, improved structures and methods for testing electromigration in semiconductor devices are needed in the art.

Embodiments of the present invention provide novel test methods and test structures that may be used to effectively and quickly measure and test temperature and/or electromigration in semiconductor devices. A temperature adjuster comprising a heater and/or cooler is disposed proximate a via between the feed line and the stress line of the test structures. A feedback loop is used to monitor and control the temperature of the via using the feedback loop and the temperature adjuster. The temperature adjuster may be adapted to heat or cool the via region, to be described further herein.

FIG. 1 shows a cross-sectional view of a test structure 100 of a semiconductor device in accordance with a preferred embodiment of the present invention. The test structure 100 includes a workpiece 102 and a temperature adjuster 104 disposed in a material layer M0 formed over the workpiece 102. A stress line 106 is disposed in a material layer M1 formed over the temperature adjuster 104. The stress line 106 may be much longer than the feed line 108, indicated by the break in the material layers 102, 112, and 106 in FIG. 1, for example. A feed line 108 is disposed in a material layer M2 proximate the material layer M1, e.g., over the stress line 106. The stress line 106 is preferably disposed proximate the feed line 108. The feed line 108 is coupled to the stress line 106 by a via (or contact) 110 disposed in a material layer V1 between the feed line 108 and the stress line 106 formed in material layers M2 and M1, respectively. The via 110 is also referred to herein as a conductive feature or a stressed via herein, for example. The temperature adjuster 104 is preferably disposed proximate at least the via 110. The temperature adjuster 104 is adapted to alter the temperature of at least the via 110, e.g., by heating or cooling 118 the via 110. A portion of the feed line 108 may also be heated by the temperature adjuster 104.

FIG. 1 also shows a feedback loop 114 that is preferably implemented external to the semiconductor device that the test structure 100 is formed in, but also may be implemented on the semiconductor device that the test structure 100 is formed in, in accordance with some embodiments of the present invention. The feedback loop 114 comprises at least one feedback device coupled to the temperature adjuster 104 and at least the via 110, and may comprise a plurality of feedback devices 114a, 114b, 114c, and 114d, as shown. Feedback device 114a may comprise a controller, for example. Feedback devices 114b and 114c may comprise temperature determinators, and feedback device 114d may comprise a signal summer. Alternatively, the feedback devices 114a, 114b, 114c, 114d may comprise other devices, circuits, or elements. The feedback loop 114 may also be implemented in software, e.g., using voltage inputs at contact points 116a, 116b, 116c, and 116d. The feedback loop 114 is preferably adapted to monitor and control a temperature of at least the via 110 and also to monitor the temperature of the stress line 106, in some embodiments.

In the exemplary embodiment of the feedback loop 114 shown in FIG. 1, the output of the feedback device 114a comprising a controller is coupled to the temperature adjuster 104, e.g., at contact point 116d. The input of the controller 114a is coupled to a signal indicating an error between a temperature difference set value and an offset between a temperature of the conductive feature 110 and a temperature of the stress line 106. The inputs of the temperature determinator 114b are coupled to contact points 116a and 116b, and the signal emitted from temperature determinator 114b indicates the temperature $T_1$ of the stressed via 110, which is input to an input of the signal summer 114d. The inputs of temperature determinator 114c are coupled to contact points 116b and 116c, and the signal emitted from temperature determinator 114c indicates the temperature $T_2$ of the stress line 106. The signal emitted from temperature determinator 114c is coupled to an input of the signal summer 114d. An offset set signal $\Delta T_{SET}$ may also be coupled to an input of the signal summer 114d. The output of the signal summer 114d is coupled to the input of the controller 114a. The feedback loop 114 is adapted to compare the temperatures $T_1$ and $T_2$ of the stressed via 110 and stress line 108, respectively, and to increase and/or decrease the temperature of at least the stressed via 110 region (e.g., and optionally, also at least a portion of the feed line 108) using the temperature adjuster 104 so that the temperatures $T_1$ and $T_2$ are substantially the same, or alternatively, to reach a predetermined intended temperature difference, e.g., by the amount of an offset set signal $\Delta T_{SET}$ input to the signal summer 114d.

To operate the test structure 100, a current 119 is run through the stress line 106 using the feed line 108, and properties of the stress line 106 such as resistance and voltage drop are measured to monitor the amount of temperature and/or electromigration in the semiconductor device the test structure 100 is formed in. Note that in the figures, the arrow representing current 119 indicates the direction of electron flow in embodiments of the present invention.

At a point in time, e.g., at a beginning of the electromigration test, the temperature $T_1$ of the stressed via 110 is determinable by sensing the temperature using contact points 116a and 116b disposed on either side of the stressed via 110. The temperature $T_2$ of the stress line 106 may be obtained by sensing the temperature using contact points 116b and 116c disposed on either end of the stress line 106. For the remaining of the electromigration tests, the output of the controller 114a may be clamped to a fixed value, in some embodiments, for example. The sense lines for measuring the electromigration effects and the temperature of stressed via 110 and stress line 106 are preferably identical, for example.

Sense lines may be coupled to the contact points 116a, 116b, and 116c in material layers M2 and M1, for example (not shown in FIG. 1; to be described further herein with reference to FIGS. 11 through 17). The temperatures $T_1$ and $T_2$ may be obtained by running a current 119 through the test structure 100, e.g., from the feed line 108 through the via 110, and through the stress line 106. The resistance of the via 110 and the stress line 106 may be determined by measuring the voltage between the contact points 116a and 116b, and 116b and 116c, respectively. The voltage between the contact points 116a and 116b, and contact points 116b and 116c, may be translated to temperature using the thermal coefficient of resistance (TCR) of the materials of the via 110 and stress line 106, for example. As the resistance increases, the temperature typically increases. Thus, the voltage and resistance of the via 110 and the stress line 106 indicates the temperature of the via 110 and the stress line 106, for example. This technique allows for the measurement of temperatures before electromigration effects begin to change the resistance of the stressed via 110 and/or stress line 106. After temperature determination, the amount of resistance change of the stressed via 110 and/or the stress line 106 indicates the effects of electromigration on the test structure 100.

To manufacture the novel test structure 100, first, the workpiece 102 is provided. The workpiece 102 may include a semiconductor substrate comprising silicon or other semiconductor materials covered by an insulating layer, for example. The workpiece 102 may also include other active components or circuits formed in other regions of the device, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) substrate, for example.

A portion of an insulating material 112 is disposed over the workpiece 102. The insulating material 112 may comprise $SiO_2$ or other dielectric material, for example. The insulating material 112 may alternatively comprise a low dielectric constant (k) material having a k value less than the k value of $SiO_2$, for example. The insulating material 112 is shown as a single layer in the figures; however, alternatively, the insulating material may comprise a plurality of insulating material layers, for example.

The temperature adjuster 104 is formed in a material layer M0 disposed over the workpiece 102, e.g., over the insulating material 112. The material layer M0 may comprise a conductive material layer that preferably comprises a semiconductive material in some embodiments, for example. The semiconductive material may or may not include salicide, for example. Alternatively, the material layer M0 may comprise a metallization layer, e.g., comprising a conductive material such as Cu, Al, and/or other metals. However, in a preferred embodiment, preferably the temperature adjuster 104 is formed in a material layer M0 that comprises a semiconductive material such as polysilicon, because electromigration does not occur in semiconductors such as polysilicon, for example. In other embodiments, the temperature adjuster 104 is formed in a material layer comprising a refractory metal such as tungsten (W) which also does not exhibit electromigration, for example.

The temperature adjuster 104 preferably comprises a heater in some embodiments. The heater may comprise a wide line of conductive material or may comprise a relatively narrow, meandering path of conductive material that functions as a heating coil. When a current is run from one end of the heater to an opposite end of the heater, the temperature of the conductive material increases. A portion of the heat is spread out along the path 118, moving upwardly towards the via 110 region and also towards a portion of the feed line 108, e.g., towards the right side of the feed line 108 proximate the via 110 region disposed above the temperature adjuster 104.

Alternatively, the temperature adjuster 104 may comprise a thermoelectric element. The temperature adjuster 104 may comprise a Peltier element, for example, that is adapted to lower the temperature of the via 110 region. The temperature adjuster 104 may comprise two dissimilar conductive materials in which one side of the temperature adjuster 104 is cooled when a current is run through the temperature adjuster 104, for example. If the temperature adjuster 104 comprises a Peltier element, the temperature adjuster 104 may also be used as a heater by reversing the polarity of the voltage applied to the Peltier element, e.g., to cause the current to flow in an opposite direction, for example. If the temperature adjuster 104 comprises a Peltier element, preferably a heatsink is used to either collect heat in a heating mode or dissipate collected heat into another medium or material in a cooling mode, for example (not shown). The temperature adjuster 104 may also include a thermal interface material (TIM) adjacent the Peltier element, for example, also not shown.

The temperature adjuster 104 can be used to heat or cool the via 110 region and optionally also the feed line 108, for example. In some embodiments, the temperature adjuster 104 may be used to alternatingly heat and cool the via 110 region, and optionally, also at least a portion of the feed line 108, for example. The temperature adjuster 104 may be used to alter the temperature of at least the via 110 region during tests or before tests, to bring the temperature of the via 110 region to a desired temperature before performing the tests, for example.

The temperature adjuster 104 is formed within an insulating material 112. The various material layers M0, M1, V1, and M2 also include an insulating material 112 formed around the various elements formed in these material layers, for example. The insulating material 112 may comprise a plurality of dielectric layers such as oxide layers, nitride layers, liners, and etch stop layers, as examples. Some of the insulating material 112 layers may comprise inter-level dielectric (ILD) layers, for example.

Next, a conductive material layer M1 is formed over the workpiece 102, as shown. The conductive material layer M1 preferably comprises a material layer where conductive lines for an integrated circuit (not shown) are formed elsewhere on the device, e.g., in a BEOL process, for example. The conductive material layer M1 may comprise a metal interconnect layer, for example. The conductive material layer M1 may comprise a first-formed interconnect layer of a multi-layer interconnect structure of a semiconductor device, or alternatively may comprise an upper interconnect or metallization layer of a semiconductor device, for example.

The stress line 106 is formed in the conductive material layer M1. The stress line 106 is separated and isolated from other conductive lines of the semiconductor device formed in the conductive material layer M1 by the insulating material 112. The stress line 106 may comprise a width ranging from a minimum design width, e.g., about 100 nm to several µm and may comprise a length of about 100 µm, as examples, although alternatively, the stress line 106 may comprise other dimensions.

Next, a via 110 is formed over the stress line 106. The via 110 is coupled to and makes electrical connection to the stress line 106. The via 110 is formed in a conductive material layer V1 of the semiconductor device, for example. The via 110 may comprise one or more vias 110 disposed between the stress line 106 and the feed line 108 (although only one via 110 is shown in the figures). Other vias may be formed elsewhere within the conductive material layer V1 in the semiconductor device, for example, not shown. The conductive material layer V1 may comprise a first-formed via interconnect level of a multi-level interconnect structure, or alternatively, the conductive material layer V1 may comprise an upper via interconnect or metallization layer, for example.

A feed line 108 is formed over the via 110. The feed line 108 is coupled to and makes electrical connection to the via 110. The feed line 108 is preferably formed in a conductive material layer M2 of the semiconductor device. Other conductive lines may be formed elsewhere within the conductive material layer M2 in the semiconductor device, for example, not shown. The conductive material layer M2 may comprise a second-formed interconnect layer of conductive lines, or alternatively may comprise an upper interconnect or metallization layer of a multi-layer interconnect structure, for example. The stressed via 110 is proximate the stress line 106 and is thus subjected to electromigration stress during testing, for example.

The feed line 108 may be widened, forming a wide metal plate, in some embodiments. The feed line 108 also functions as a heatsink, or a heat collector, in these embodiments. However, in other embodiments, the feed line 108 may comprise a thin conductive line, e.g., having about the same width as the stress line 106.

The conductive material layer M2 preferably comprises the same thickness as the conductive material layer M1, in some embodiments, for example. The conductive material layer V1 may also comprise the same thickness as the conductive material layers M1 and M2, for example. Alternatively, conductive material layers M1, M2, and V1 may comprise different thicknesses. The conductive material layers M1 and M2 preferably comprise Al, Cu, combinations thereof, and/or other metals. Conductive material layer V1 preferably comprises W, Cu, Al, combinations thereof, and/or other metals, for example.

The conductive material layers M1, V1, and M2 may also comprise other metallization layers within the semiconductor device, e.g., formed in upper metallization layers of the device; e.g., Mx, Vx, and M(x+1) interconnect levels. The temperature adjuster 104 may alternatively be formed above the feed line 108 and the stress line 106 e.g., in interconnect levels M(x+2), for example.

The feed line 108, stress line 106, via 110, and the temperature adjuster 104 may be formed using damascene techniques, e.g., by depositing the insulating material layers 112, patterning the insulating material layers 112, and filling in the patterned insulating material layers 112 with a conductive material. The excess conductive material is removed from over the insulating material layers 112 using chemical-mechanical polish (CMP) processes and/or etch processes, as examples. Single and/or dual damascene techniques may be used, for example. Alternatively, the feed line 108, stress line 106, via 110, and the temperature adjuster 104 may be formed using subtractive techniques, e.g., by depositing a conductive material, patterning the conductive material, and depositing the insulating material layers 112 between the feed line 108, stress line 106, via 110, and the temperature adjuster 104.

The feed line 108 is also referred to herein as a first conductive line. The stress line 106 is also referred to herein as a second conductive line. Again, the via 110 is also referred to herein as a conductive feature or a stressed via.

The feedback loop 114 including feedback devices 114a, 114b, 114c, and 114d in FIG. 1 may be formed in hardware, software, or hardware and software, for example. The feedback devices 114a, 114b, 114c, and 114d shown in a schematic representation in FIG. 1 may be formed in the workpiece 102 elsewhere on the semiconductor device or chip (not shown) that the test structure 100 is formed on, and may be connected to the temperature adjuster 104 and the contact points 116a, 116b, 116c, and 116d by conductive lines formed in the conductive material layers M0, M1, and M2, for example. Alternatively, the feedback loop 114 may comprise hardware and/or software located external to the semiconductor device that the test structure 100 is formed on, for example.

The test structure 100 achieves homogeneity of the feed line 108 and the stress line 106 by providing the ability to actively adjust the temperature of the via 110 region, e.g., using the temperature adjuster 104. The feedback loop 114 assures temperature uniformity in the test structure 100. The feedback devices 114a, 114b, 114c, and 114d may be used to compare the temperature of the via 110 to the temperature of the stress line 106, and if the via 110 is cooler than the temperature of the stress line 106, the via 110 may be heated by the temperature adjuster 104. Likewise, if the via 110 is warmer than the temperature of the stress line 106, the via 110 may be cooled by the temperature adjuster 104, for example. Alternatively, the via 110 may be intentionally made warmer or cooler than the stress line 106 by the predetermined amount of the offset set signal $\Delta T_{SET}$.

Current 119 is supplied to the test structure 100 from the left of FIG. 1 by applying a current source or supply to the left side of the feed line 108. The current 119 runs to the right through the feed line 108, downwardly through the via 110, and through the stress line 106 to a current return disposed at the right side of the stress line 106. Thus, the test structure 100 shown in FIG. 1 comprises a downstream configuration. The term "downstream" is used herein to refer to a current 119 flow (which represents electron flow) that flows downwardly from a top surface of a semiconductor device (e.g., from upper levels of interconnect such as M2) towards lower levels of interconnect structures (e.g., M1). The current 119 may be introduced by applying a supply current and return to two test pads (not shown) on the semiconductor device, for example.

Measurements of the electromigration effects of the test structure 100 are taken by sense lines (not shown in FIG. 1; see FIG. 11 at 242 and 244, as examples) that make contact at contact points 116b and 116c at each end of the stress line 106 and/or to either side of the via 110 at contact points 116a and 116b, for example, by measuring the voltage and/or resistance of the stress line 106 and/or the via 110.

Figure 2:
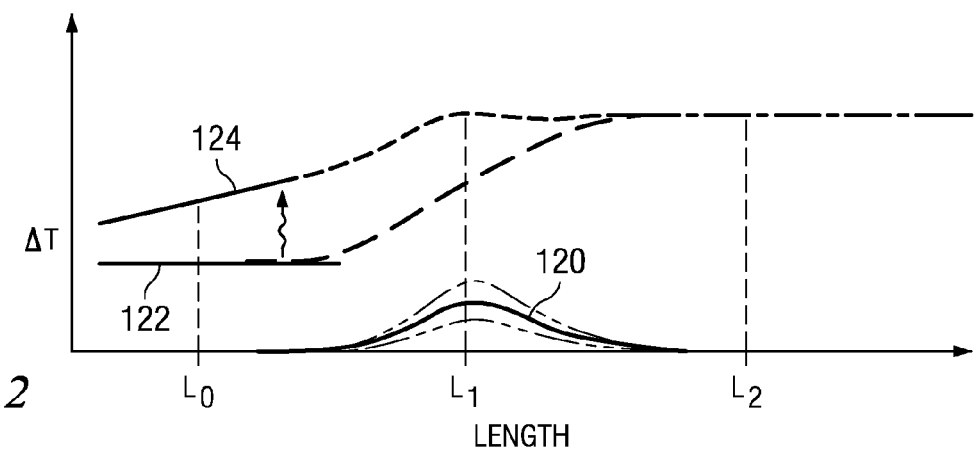
FIGS. 2 and 3 are graphs illustrating effects of the temperature adjuster and feedback loop on temperature uniformity of the test structure shown in FIG. 1.
Figure 3:
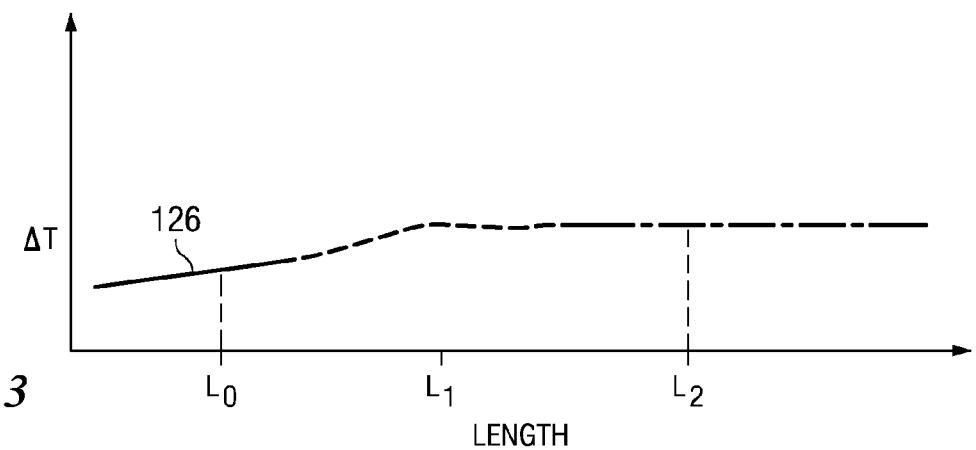

FIGS. 2 and 3 are graphs illustrating effects of embodiments of the present invention on temperature uniformity of the test structure shown in FIG. 1. FIG. 2 is a graph of temperature along the length of the test structure 100 shown in FIG. 1, wherein the temperature of the via 110 is raised to the same temperature as the stress line 106 by embodiments of the present invention. Changes or increases in temperature along the length are due to Joule's heating, for example. The heating of the via 110 is shown in graph 120 at $L_1$ including process fluctuations shown as dashed/dotted lines. The temperature of the feed line 108 without heating is shown at 122 at $L_0$. The temperature of the feed line 108 with heating using the temperature adjuster 104 of embodiments of the present invention is shown at 124 at temperature $L_0$. An increase in the via 110 temperature at $L_1$ can be seen at 124, for example. The temperature at $L_2$ of the stress line 106 is also shown at 124. FIG. 3 is a graph 126 illustrating the resulting controlled uniform temperature across the length of the novel test structure 100 using the temperature adjuster 104 and feedback loop 114 of an embodiment of the present invention.

The stressed via 110 comprises regions that have a potential to experience temperature variations due to the increased resistance of the via 110 compared to the resistance of the feed line 108 and due to intentionally keeping the feed line 108 cooler compared to the stress line 106. The lower temperature of the feed line 108 can be reached by forming a feed line 108 that has a greater width than the width of the stress line 106, for example. However, advantageously, the test structure 100 provides a homogeneous temperature uniformity along the length, due the ability to actively adjust the temperature of the feed line 108 and the via 110 region using the temperature adjuster 104. The temperature adjuster 104 and the optional feedback loop 114 may be used to improve temperature uniformity around the via 110.

Figure 4:
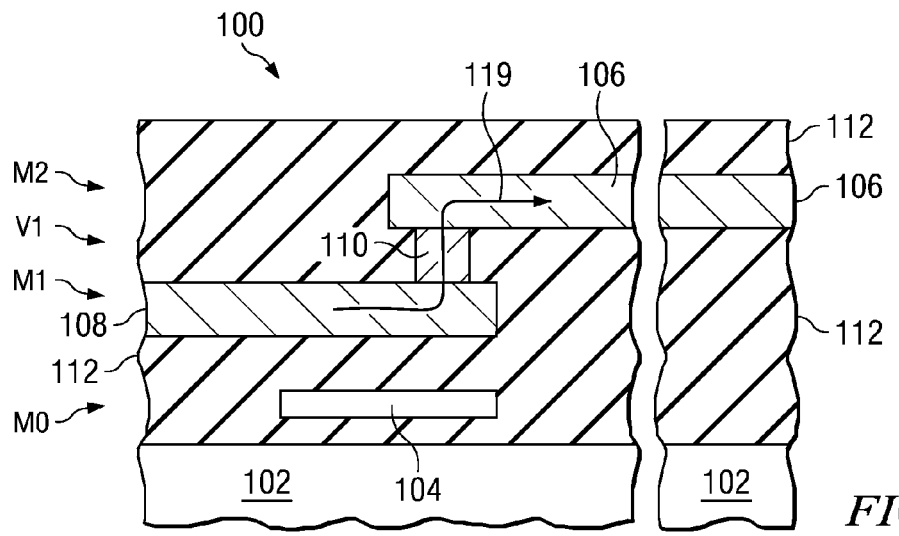
FIG. 4 is a cross-sectional view of a test structure in accordance with an embodiment of the present invention that includes a temperature adjuster proximate a via between a feed line and a stress line, wherein current is run through the via in an upstream direction.

FIG. 4 is a cross-sectional view of a test structure 100 in accordance with a preferred embodiment of the present invention that includes a temperature adjuster 104 proximate a via 110 between a feed line 108 and a stress line 106, wherein current 119 is run through the via 110 in an upstream direction. The term "upstream" is used herein to refer to a electron flow that flows upwardly from lower levels of interconnect structures (e.g., M1) towards a top surface of a semiconductor device (e.g., towards an upper level of interconnect M2). Like numerals are used for the various elements that were used to describe FIG. 1. To avoid repetition, each reference number shown in FIG. 4 is not described again in detail herein. Rather, similar materials are preferably used for the various element numbers 102, 104, 106, etc. . . . that were used to describe the element numbers in FIG. 1.

In the embodiment shown in FIG. 4, the feed line 108 is formed in conductive layer M1, and the stress line 106 is formed in conductive layer M2, as shown. The temperature adjuster 104 is formed in conductive layer M0 which preferably comprises a semiconductive material in some embodiments, although alternatively, conductive layer M0 may comprise a metal.

In the preferred embodiments of the present invention shown in FIGS. 1 and 4, the temperature adjuster 104 is preferably disposed proximate at least the via 110. The temperature adjuster 104 is also optionally disposed proximate at least a portion of the feed line 108. The temperature adjuster 104 preferably does not make contact with the feed line 108 in these embodiments, for example.

Figure 5:
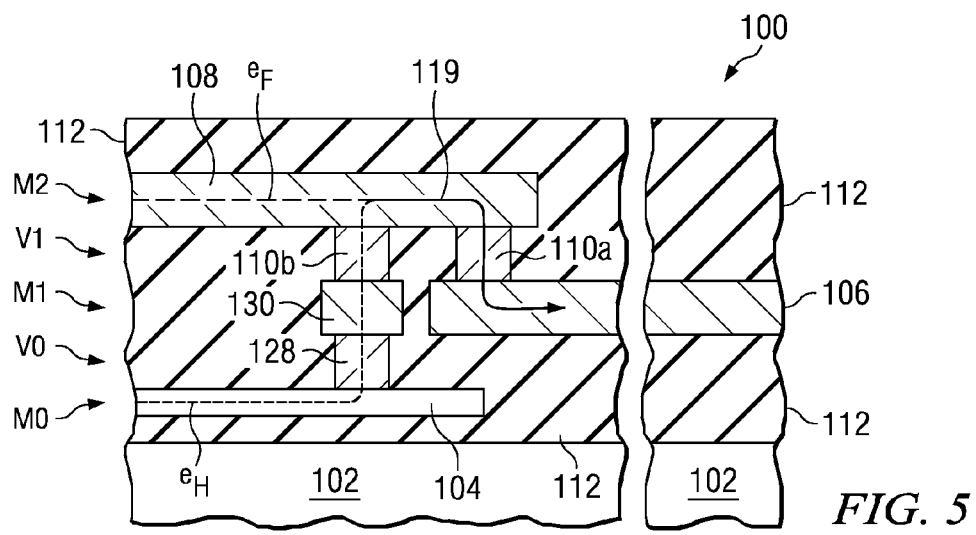
FIG. 5 shows an embodiment of the present invention wherein a temperature adjuster makes contact with a top portion of a via.
Figure 6:
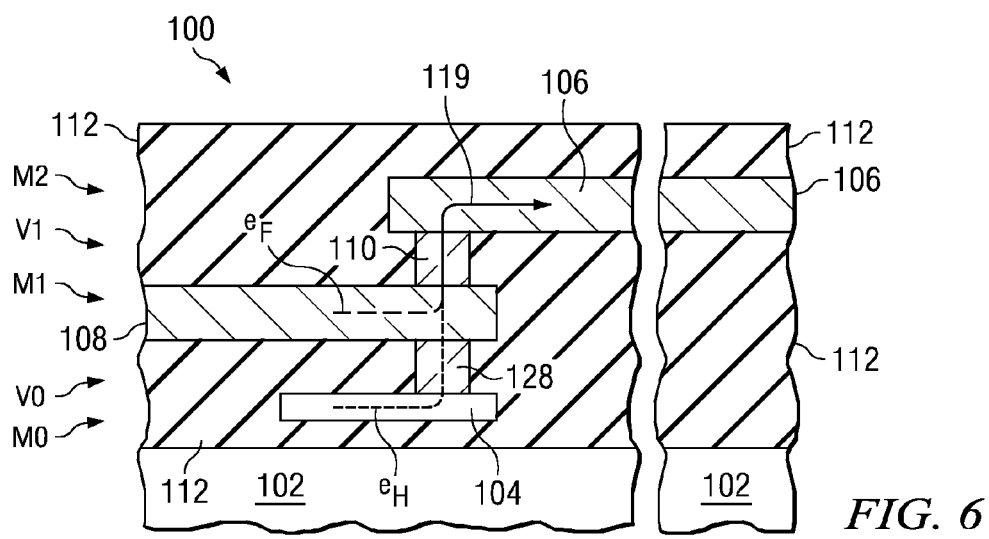
FIG. 6 shows an embodiment of the present invention wherein a temperature adjuster makes contact with a bottom portion of a via.

However, in other preferred embodiments of the present invention, preferably, the temperature adjuster 104 is coupled to and makes contact with the feed line 108, as shown in FIGS. 5 and 6 in cross-sectional views. FIG. 5 shows an embodiment of the present invention wherein a temperature adjuster 104 makes contact with a top portion of a via 110a, e.g., through a feed line 108 which is adjacent the via 110a. The stressed via 110a is heated by the top contact of the temperature adjuster 104, for example. The temperature adjuster 104 is formed in conductive layer M0 and is coupled to the feed line 108 by vias 128 and 110b and a pad 130 formed in conductive layers V0, M1, and V1, respectively, as shown. Pad 130 provides vertical electrical connection to via layers V0 and V1 for the temperature adjuster 104 to the feed line 119, for example. The test structure 100 comprises a downstream configuration, wherein the feed line 108 is formed in an upper conductive line layer M2 and current 119 flows downwardly through via 110a to the stress line 106 formed in conductive line layer M1.

In this embodiment, the temperature adjuster 104 provides a portion $e_H$ of the current 119 through the via 110a during a test process. A current supply is coupled to a left side of the feed line 108 and a current return/temperature adjuster return is coupled to the right side of the stress line 106. A temperature adjuster supply is coupled to the left side of the temperature adjuster 104. The current 119 through the via 110a comprises two components: the current $e_F$ through the feed line 108 and the current $e_H$ through the temperature adjuster 104. Thus, the electron flow 119 may be determined using Equation 1, below.

$$e_{119} = e_F + e_H \qquad \text{Eq. 1}$$

The ratio of the currents $e_H$ and $e_F$ determines the temperature of the via 110a in this embodiment, for example.

FIG. 6 shows an embodiment of the present invention wherein a temperature adjuster 104 makes contact with a bottom portion of a via 110, e.g., through a feed line 108. The via 110 is heated by the bottom contact of the feed line 108 with the temperature adjuster 104, for example. The test structure 100 comprises an upstream configuration, wherein the feed line 108 is formed in a lower conductive line layer M1 and current 119 flows upwardly through via 110 to the stress line 106 formed in conductive line layer M2. The temperature adjuster 104 is formed in conductive layer M0 and is coupled to the feed line 108 by via 128 formed in conductive layer V0, as shown. In this embodiment, the temperature adjuster 104 provides a portion $e_H$ of the current 119 through the via 110a during a test process. The current 119 through the via 110a comprises two components: the current $e_F$ through the feed line 108 and the current $e_H$ through the temperature adjuster 104. Thus, the current 119 may be determined using Equation 1 above.

Note that in the embodiments shown in FIGS. 5 and 6, a feedback loop 114 shown in FIG. 1 is preferably also included in the test structures 100, to provide feedback regarding the temperature of the vias 110a and 110, respectively, in comparison to the temperature of the stress line 106, for example. Alternatively, the temperatures $T_1$ and $T_2$ of the vias 110a and 110 and the stress line 106 may be monitored, and the temperature adjuster 104 may be used to raise or lower the temperature $T_1$ of the via 110 as desired before or during a test procedure, for example.

Note also that in FIGS. 1, 4, 5, and 6, insulating material 112 is shown disposed beneath the upper conductive lines, e.g., feed lines 108 and/or stress lines 106. An insulating material 112 is also preferably disposed above the feed lines 108 and/or stress lines 106 in the upper metallization layers M2, for example, as shown. The insulating material 112 may comprise a plurality of insulating material layers, for example.

Figure 10:
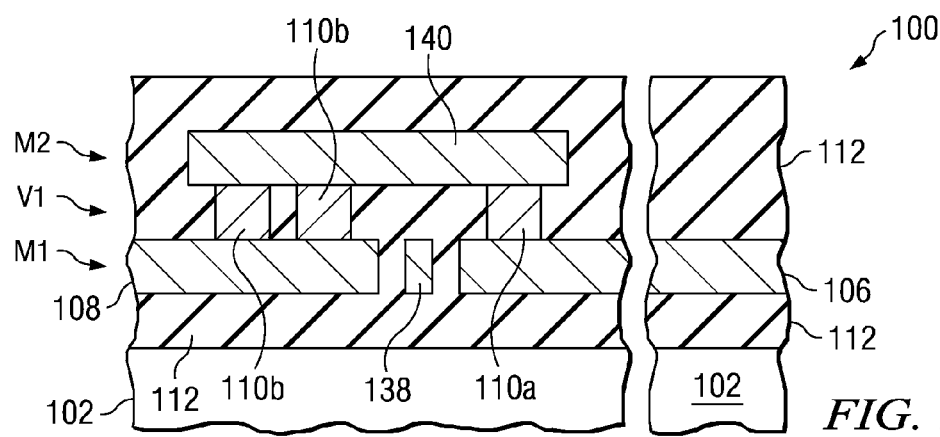
FIG. 10 shows an embodiment wherein the feed line is formed in the same conductive material layer as the stress line, and wherein the temperature adjuster is disposed perpendicular to the feed line and the stress line.

In FIGS. 1, 4, 5, and 6, the feed line 108 may comprise a thin conductive line having substantially the same width as the stress line 106, in some embodiments. This is particularly advantageous if the temperature adjuster 104 comprises a cooling device adapted to remove the heat generated in the stressed via 110, for example. The feed line 108 and the stress line 106 may then be kept at about the same temperature. In applications wherein the feed line 108 comprises substantially the same width as the stress line 106, the feed line 108 may be formed in the same metallization level as the stress line 106 in a single conductive material layer, for example, as shown in FIG. 10, to be described further herein, and also as described in U.S. patent application Ser. No. 11/702,975, filed on Feb. 6, 2007, entitled, "Semiconductor Device Test Structures and Methods," which is incorporated herein by reference.

However, in other embodiments, the feed line 108 preferably comprises a wider plate having a width that is greater than the width of the stress line 106, for example. A wider feed line 108 results in less Joule's heating and higher heat dissipation in the feed line 108. The feed line 108 having a greater width than the width of the stress line 106 is advantageous because electromigration effects are reduced in the feed line 108 and the temperature in the feed line 108 is kept lower than in the stress line 106, so that even with heating of the stressed via 110, the stressed via 110 temperature stays below the temperature of the stress line 106. The remaining temperature difference may then be adjusted using the temperature adjuster 104, for example.

Figure 7:
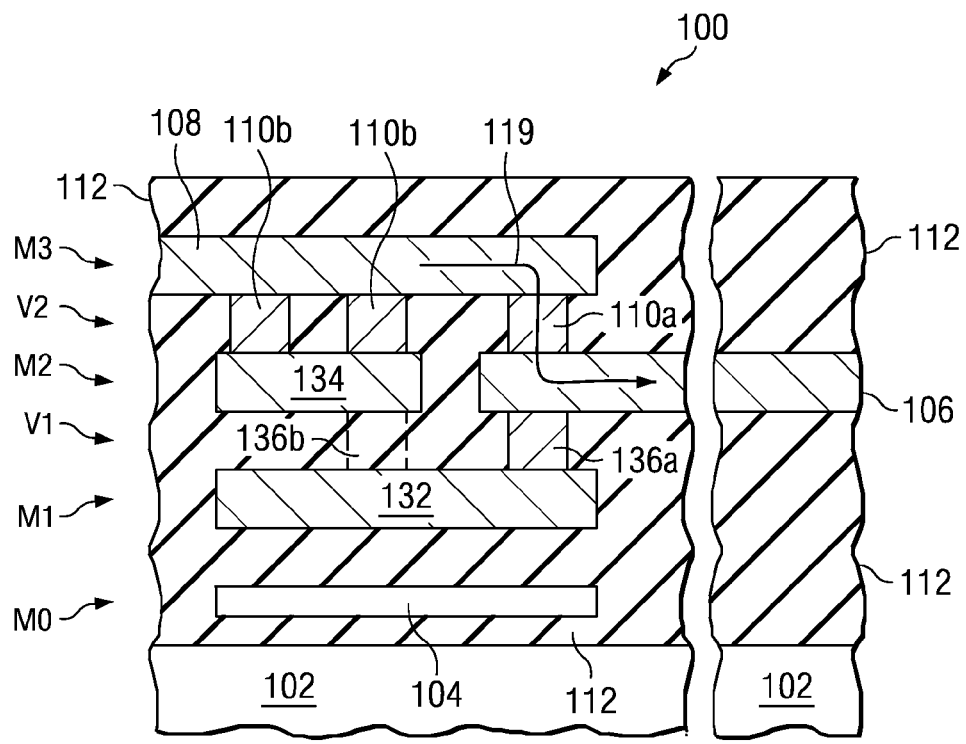
FIGS. 7 and 8 show cross-sectional views of embodiments of the present invention that include heat collectors proximate the via of the test structure.
Figure 8:
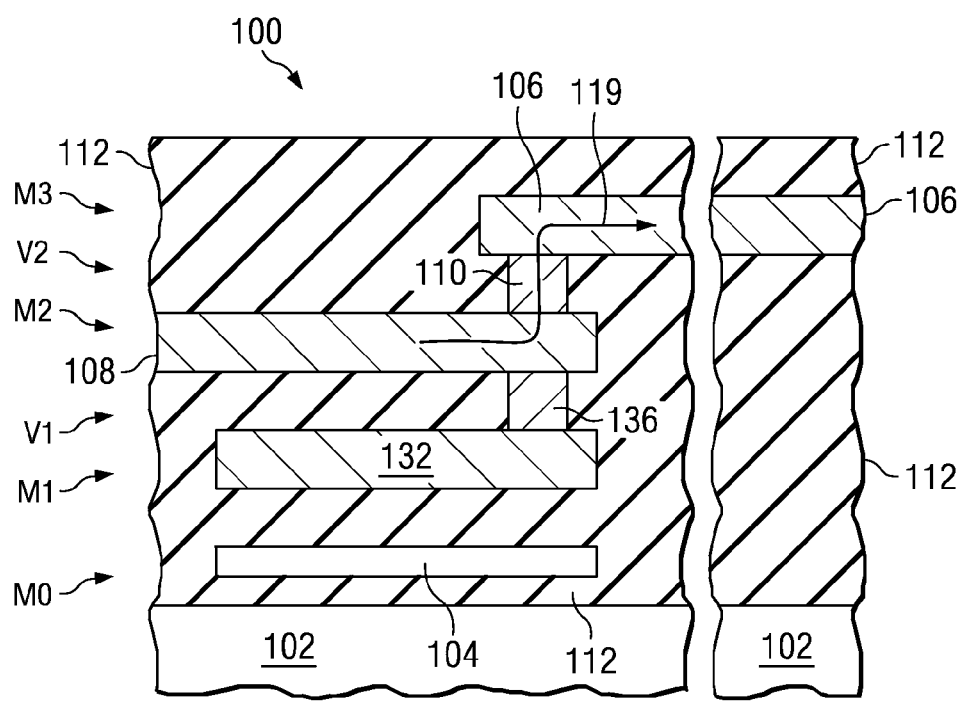

FIGS. 7 and 8 show cross-sectional views of preferred embodiments of the present invention that include heat collectors 132 and 134 proximate the stressed vias 110a and 110 of the test structures 100. Again, like numerals are used for the various elements that were used to describe the elements in the previous figures, and to avoid repetition, each reference number shown in FIGS. 7 and 8 is not described again in detail herein.

FIG. 7 shows a test structure 100 comprising a downstream configuration in accordance with an embodiment of the present invention, wherein the feed line 108 is formed in an upper conductive line layer M3 and current 119 flows downwardly through stressed via 110a to the stress line 106 formed in conductive line layer M2. The temperature adjuster 104 is formed in conductive layer M0 disposed beneath the via 110a and the feed line 108.

A heat collector 132 is disposed beneath the via 110a and also beneath the feed line 108, as shown. The heat collector 132 preferably comprises a wide metal plate formed in conductive layer M1 disposed above and proximate the temperature adjuster 104, as shown. The heat collector 132 preferably comprises a heatsink that facilitates in transferring heat between the temperature adjuster 104 and the via 110a, for example.

The heat collector 132 may optionally be coupled to the stress line 106 using one or more vias 136a formed in conductive layer V1, as shown. Coupling the heat collector 132 to the stress line 106 further facilitates in the transference of the temperature of the temperature adjuster 104 to the via 110a when the current 119 is run through during electromigration tests, for example. The heat collector 132 absorbs heat from a portion of the test structure 100 having a greater temperature, e.g., from the via 110a or the temperature adjuster 104.

An optional heat collector 134 may also be formed in conductive layer M2 above the heat collector 132 formed in conductive layer M1, as shown. Heat collector 134 also comprises a heatsink comprising a metal plate. Heat collector 132, heat collector 134, and the feed line 108 may comprise wide plates that are positioned parallel to one another in conductive layers M1, M2, and M3, for example. Heat collector 134 may optionally be coupled to the feed line 108 by vias 110b formed in conductive layer V2, as shown. Only two vias 110b are shown in FIG. 7; however, alternatively, a plurality of vias 110b may be used to thermally couple the heat collector 134 to the feed line 108, for example.

Rather than coupling the heat collector 134 to the feed line 108 as previously described herein, the heat collector 132 may optionally be coupled to the feed line 108 using at least one via 136b formed in conductive layer V1, as shown in phantom in FIG. 7. The heat collectors 132 and 134 and optional vias 110b, 136a or 136b advantageously facilitate in temperature transfer through the various material layers M0, M1, V1, M2, V2, and M3 of the test structure 100, for example.

FIG. 8 shows a test structure 100 comprising an upstream configuration in accordance with another embodiment of the present invention, wherein the feed line 108 is formed in a lower conductive line layer M2 and current 119 flows upwardly through via 110 to the stress line 106 formed in conductive line layer M3. The temperature adjuster 104 is formed in conductive layer M0 and is disposed proximate the feed line 108, e.g., proximate a heat collector 132 disposed between the temperature adjuster 104 and the feed line 108. The heat collector 132 is optionally coupled to the feed line 108 by a via 136 formed in conductive layer V1, as shown. A heat collector 132 is formed in a conductive layer M1 proximate the temperature adjuster 104. Advantageously, the heat collector 132 facilitates in transferring the temperature changes and adjustments made by the temperature adjuster 104. The heat collector 132 may comprise a wide plate formed in conductive layer M1 that may be optionally coupled to the feed line 108 by one or more vias 136 formed in conductive layer V1, as shown.

Again, the test structures 100 shown in FIGS. 7 and 8 preferably include the feedback loop 114 shown in FIG. 1, for example.

Figure 9:
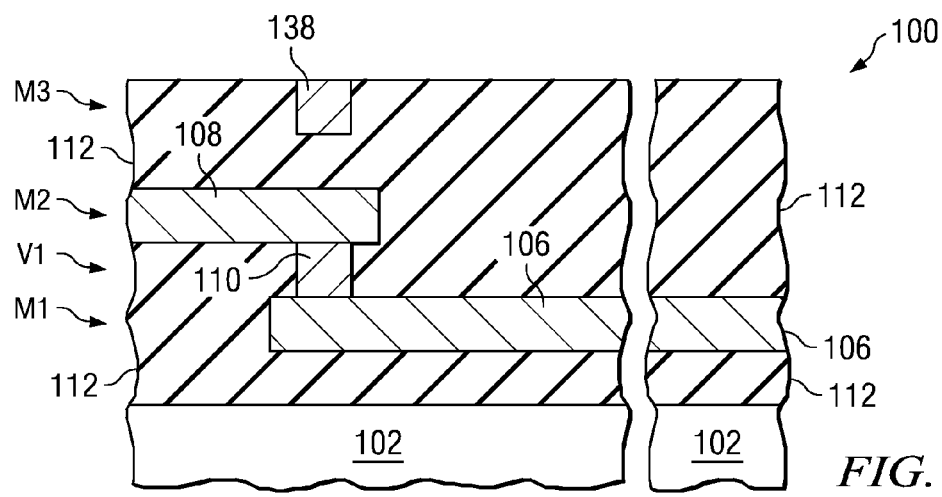
FIG. 9 shows an embodiment of the present invention wherein a temperature adjuster is disposed in a direction perpendicular to the test structure.

In the embodiments of the present invention shown in FIGS. 1, 4, 5, 6, 7, and 8, the novel temperature adjusters 104 of embodiments of the present invention comprise heating or cooling elements or features disposed in a direction substantially parallel to the test structures 100, e.g., parallel to the feed line 108, via 110 or 110a, and stress line 106. However, alternatively, the novel temperature adjusters of embodiments of the present invention may be formed in a direction perpendicular to the test structures 100 comprised of the feed line 108, via 110 and stress line 106. FIGS. 9 and 10 show cross-sectional views of embodiments of the present invention wherein the temperature adjuster comprises a conductive line 138 disposed perpendicular to the feed line 108, via 110 or 110a, and stress line 106. Optionally, the conductive line 138 may be extended to any shape disposed beside the test structure 100, and the conductive line 138 may form a heating/cooling device (e.g., a temperature adjuster) itself. Optionally, the conductive line 138 may be connected to any other layer which may include cooling or heating devices, for example, not shown.

FIG. 9 shows an embodiment wherein the temperature adjuster 138 is disposed in a direction perpendicular in the test structure to the feed line 108, via 110, and stress line 106, proximate the via 110 in a conductive layer M3 disposed above the via 110. The temperature adjuster 138 comprises a conductive line formed in the conductive layer M3 that runs in and out of the page, e.g., perpendicular to the feed line 108, via 110, and stress line 106. Current for electromigration tests is run from left to right through the feed line 108, via 110, and stress line 106. Current is run through the temperature adjuster 138 conductive line to heat or cool the via 110 region and optionally also the feed line 108, for example.

FIG. 10 shows an embodiment wherein the feed line 108 is formed in the same conductive material layer M1 as the stress line 106, and wherein the temperature adjuster 138 is perpendicular to the feed line 108 and the stress line 106. The temperature adjuster 138 is formed in the same conductive material layer M1 as the feed line 108 and the stress line 106 in this embodiment, for example.

In this embodiment, more than a single via 110a is required to couple together the feed line 108 and the stress line 106. The feed line 108 and the stress line 106 are preferably coupled together by a conductive feature comprising at least one first via 110a and at least one second via 110b formed in conductive layer V1 adjacent conductive layer M1, and a link 140 formed in a conductive layer M2 disposed adjacent to conductive layer V1, as shown.

The test structure 100 shown in FIG. 10 is particularly advantageous in that temperature homogeneity of the test structure 100 is further improved by forming the feed line 108 in the same conductive material layer M1 that the stress line 106 is formed in. The feed line 108 and the stress line 106 advantageously comprise the same thickness and also may be designed to have the same width; thus, the feed line 108 and the stress line 106 have even Joule's heat generated and even heat dissipation per given length.

Note that in the embodiments shown in FIGS. 9 and 10 comprising perpendicular temperature adjusters 138, optional heat collectors 132 and 134 (see FIGS. 7 and 8) may optionally also be included. The feedback loop shown in FIG. 1 is also preferably included in the embodiments shown in FIGS. 9 and 10, for example.

Furthermore, the stressed via 110a susceptible to problems during electromigration tests, e.g., from breaks or voids forming proximate the via 110a due to electromigration, is the via of interest during or after the testing procedures using the test structure 100, and thus, sense lines are preferably coupled above and below this via 110a, as shown in FIG. 1 at contact points 116a and 116b. Thus, the test structure 100 shown in FIG. 10 comprises a downstream configuration: e.g., current flows downwardly through the via 110a most proximate the stress line 106, which is also monitored, using contact points 116b and 116c shown in FIG. 1. Embodiments of the present invention also include test structures similar to the test structure 100 shown in FIG. 10, wherein an upstream configuration is implemented. For example, the link 140 and vias 110a and 110b may be formed in conductive layers M0 and V0 disposed below the conductive layer M1 that the feed line 108 and the stress line 106 are formed in: e.g., a test structure in accordance with an embodiment of the present invention may comprise an "upside-down" version of the test structure 100 shown in FIG. 10.

Embodiments of the present invention may be implemented in many configurations and using combinations of a variety of the optional features described herein. FIGS. 11 through 17 show perspective views of test structures 200, 300, 400, 500, 600, 700, and 800 in accordance with several preferred embodiments of the present invention, for example. Like numerals are used for the various elements that were used to describe the elements in the previous figures. To avoid repetition, each reference number shown in FIGS. 11 through 17 is not described again in detail herein. Rather, similar materials x02, x04, x06, x08, etc. . . . are preferably used for the various material layers shown as were described for FIGS. 1 and 4 through 10, where x=1 in FIGS. 1 and 4 through 10, x=2 in FIG. 11, x=3 in FIG. 12, x=4 in FIG. 13, x=5 in FIG. 14, x=6 in FIG. 15, x=7 in FIG. 16, and x=8 in FIG. 17. As an example, the preferred and alternative materials and dimensions described for the novel temperature adjuster 104 in the description for FIGS. 1 and 4 through 10 are preferably also used for the temperature adjuster 204 shown in FIG. 11.

Figure 11:
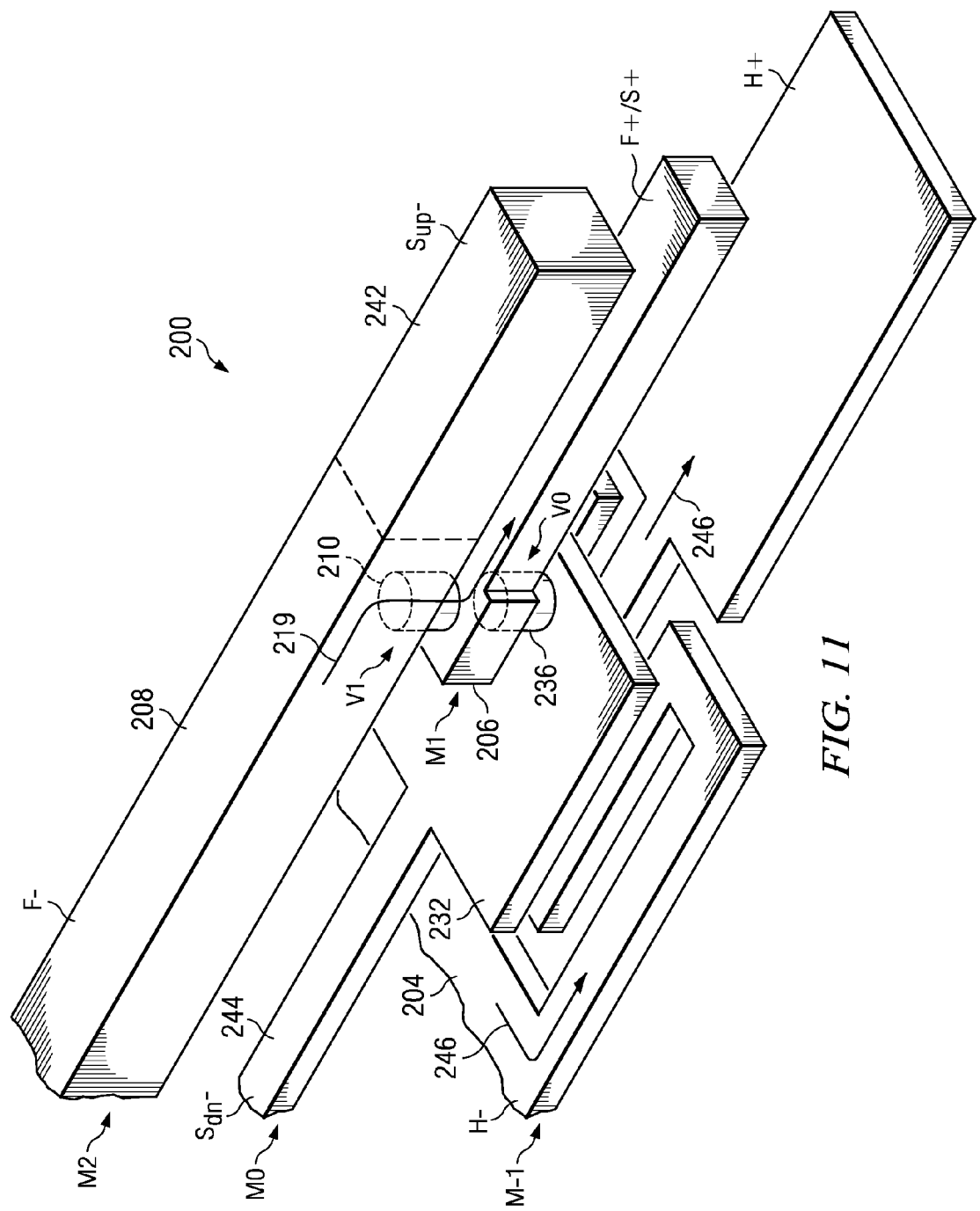
FIGS. 11 through 16 show perspective views of test structures in accordance with several preferred embodiments of the present invention.

FIG. 11 illustrates a perspective view of a test structure 200 comprising a downstream configuration. Temperature adjuster 204 is formed in a lower conductive layer M-1 of the semiconductor device. The temperature adjuster 204 comprises a winding path of conductive material disposed beneath the stressed via 210 region. Current 246 is run through the temperature adjuster 204 by applying a voltage H− and H+ across the temperature adjuster 204.

A heat collector 232 is disposed in a conductive material layer M0 adjacent conductive layer M-1. The heat collector 232 comprises a wide metal plate disposed parallel to the temperature adjuster 204. The heat collector 232 is coupled to the stress line 206 formed in conductive layer M1 by a via 236 formed in conductive layer V0. The stress line 206 may comprise a length of about 300 μm, as an example, although the stress line 206 may alternatively comprise other dimensions. The stress line 206 is actually substantially longer than the feed line 208, not shown in FIG. 11 (e.g., the stress line 206 extends to the right). Conductive layer M0 also includes a sense line 244 for signal $S_{dn-}$ coupled to the heat collector 232, as shown. The sense line 244 is coupled to the stress line 206 and thus also to the bottom of the stressed via 210, through the heat collector 232 and via 236.

The feed line 208 is formed in upper conductive layer M2. A sense line 242 for signal $S_{up-}$ is also formed in conductive layer M2 and is coupled to the feed line 208; thus, the sense line 242 is also coupled to the top of the stressed via 210. The feed line 208 may be wider than the stress line 206 to lower the temperature of the feed line 208 relative to the temperature of the stress line 206 in this embodiment, for example. The feed line 208 may also be thicker than the stress line 206, as shown in FIG. 11. The sense line 242 assists in the dissipation of heat emanating from the test structure 200, e.g., from the via 210.

Current 219 is run downwardly through via 210 during electromigration tests from the feed line 208 to the stress line 206 in this embodiment, by applying a voltage F− and F+ to the test structure 200. Depending on the stress line 206 width, the current 219 may comprise on the order of about hundreds of milliamperes (mA), and for narrow lines, the current 219 may comprise the order of about tens of mA, as examples, although other amounts of current 219 may also be used for electromigration tests using the test structure 200. Measurements can be made and monitored using the sense lines 242 and 244, e.g., by observing the signals $S_{dn-}$ and $S_{up-}$ to S+, to determine the electromigration effects on the via 210. Another measurement may be made and monitored of the right side of the stress line 206 at sense line S+ and compared to signal $S_{dn-}$ to determine the electromigration effects on the stress line 206, for example.

Figure 12:
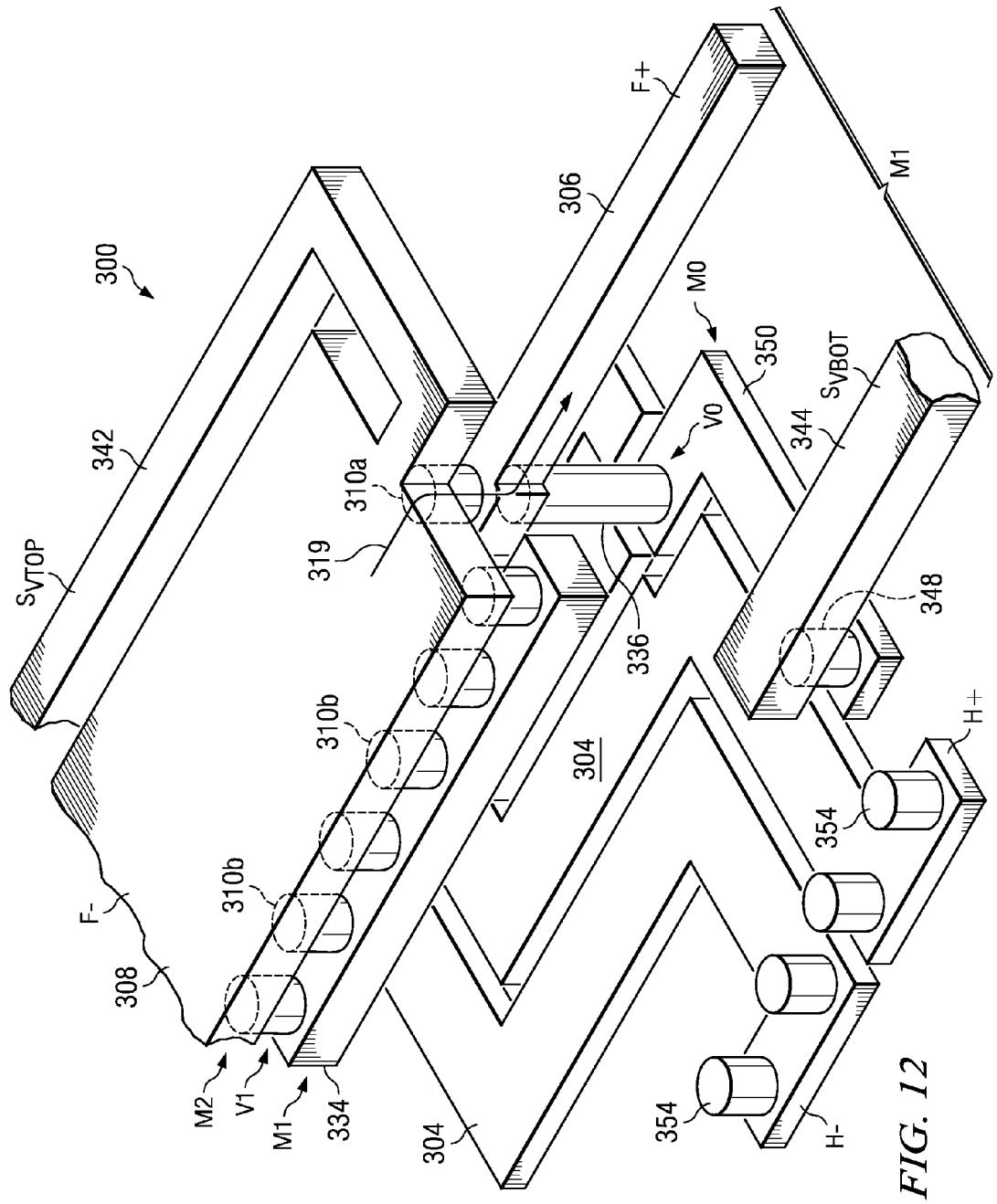

FIG. 12 shows a test structure 300 also having a downstream configuration and including a heat collector 334 formed in conductive layer M1. The heat collector 334 is coupled to the feed line 308 by a plurality of vias 310b formed in conductive layer V1. The feed line 308 is formed in an upper conductive layer M2. The feed line 308 includes a wide metal plate that also functions as a heatsink, e.g., a heat collector, for dissipating temperature changes caused by the temperature adjuster 304, for example. A sense line 342 is also formed in conductive layer M2 and is coupled to the feed line 308; thus, the sense line 342 is also coupled to the top of the stressed via 310a. The sense line 342 is coupled to a signal $S_{VTOP}$, as shown. The stress line 306 may comprise a length of about 300 μm, as an example, although the stress line 306 may alternatively comprise other dimensions.

A temperature adjuster 304 is formed in the lower conductive layer M0 connected to supply lines (not shown) for H− and H+ using vias 354, for example. A portion of the conductive layer M0 is also used to route connections for a sense line 344 formed in conductive layer M1 in this embodiment. For example, a via 336 makes electrical connection to the stress line 306, and thus also the bottom of via 310a. A conductive line 350 formed in conductive layer M0 is coupled to via 336, and conductive line 350 is coupled using via 348 in conductive layer V0 to sense line 344 which is connected to sense line signal $S_{VBOT}$, as shown.

The heat collector 334 advantageously assists in transferring temperature increases or decreases by the temperature adjuster 304 upwardly to the via 310a and feed line 308 in this embodiment, for example. The feed line 308 includes a wide plate region comprising a heat collector adapted to further assist in the dissipation of the temperature changes.

Figure 13:
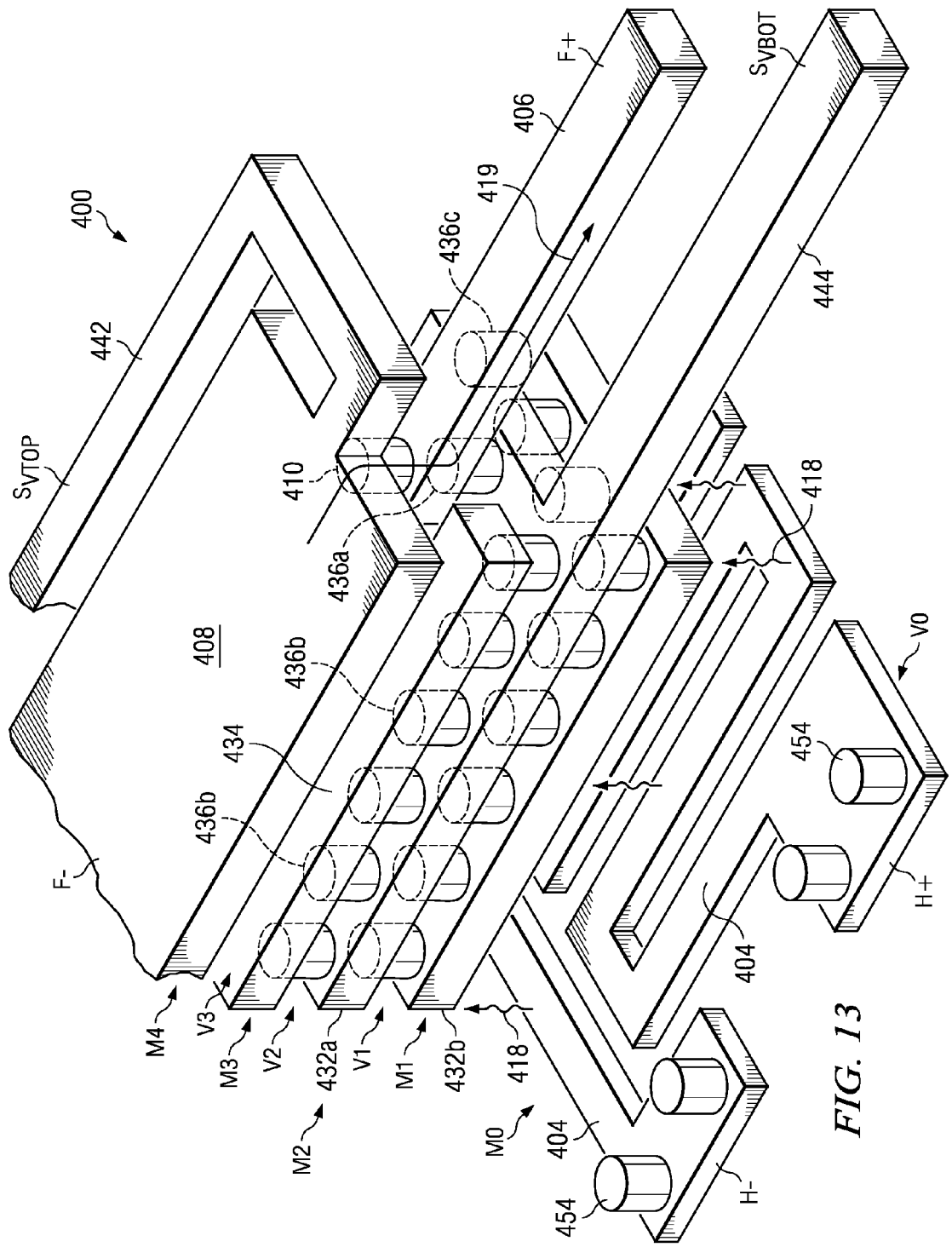

FIG. 13 shows yet another embodiment of the present invention configured in a downstream configuration. The test structure 400 includes a plurality of heat collectors 432a, 432b, and 434 formed in conductive layers M1, M2, and M3, respectively. The feed line 408 is formed in a top conductive layer M4, and the stressed via 410 coupling the feed line 408 to the stress line 406 is formed in conductive layer V3. Heat collector 432a is coupled to heat collector 432b by at least one via 436a formed in conductive layer V1, and heat collector 432a is coupled to heat collector 434 by vias 436b formed in conductive layer V2. Via 436c couples heat collector 432a to the stress line 406.

Sense line 442 for signal $S_{VTOP}$ is coupled to the top of via 410 by being coupled to the feed line 408. The feed line 408 includes a wide region that functions as a heat collector disposed above the stack of heat collectors 432a, 432b, and 434 which are disposed above the temperature adjuster 404. Sense line 444 for signal $S_{VBOT}$ is coupled to the bottom of via 410 by being coupled to the heat collector 432a, which is coupled to via 436a that is coupled to the stress line 406 proximate via 410. The current 419 flows during electromigration tests in a downstream direction through the via 410, by applying voltage F− and F+ across the test structure 400.

Figure 14:
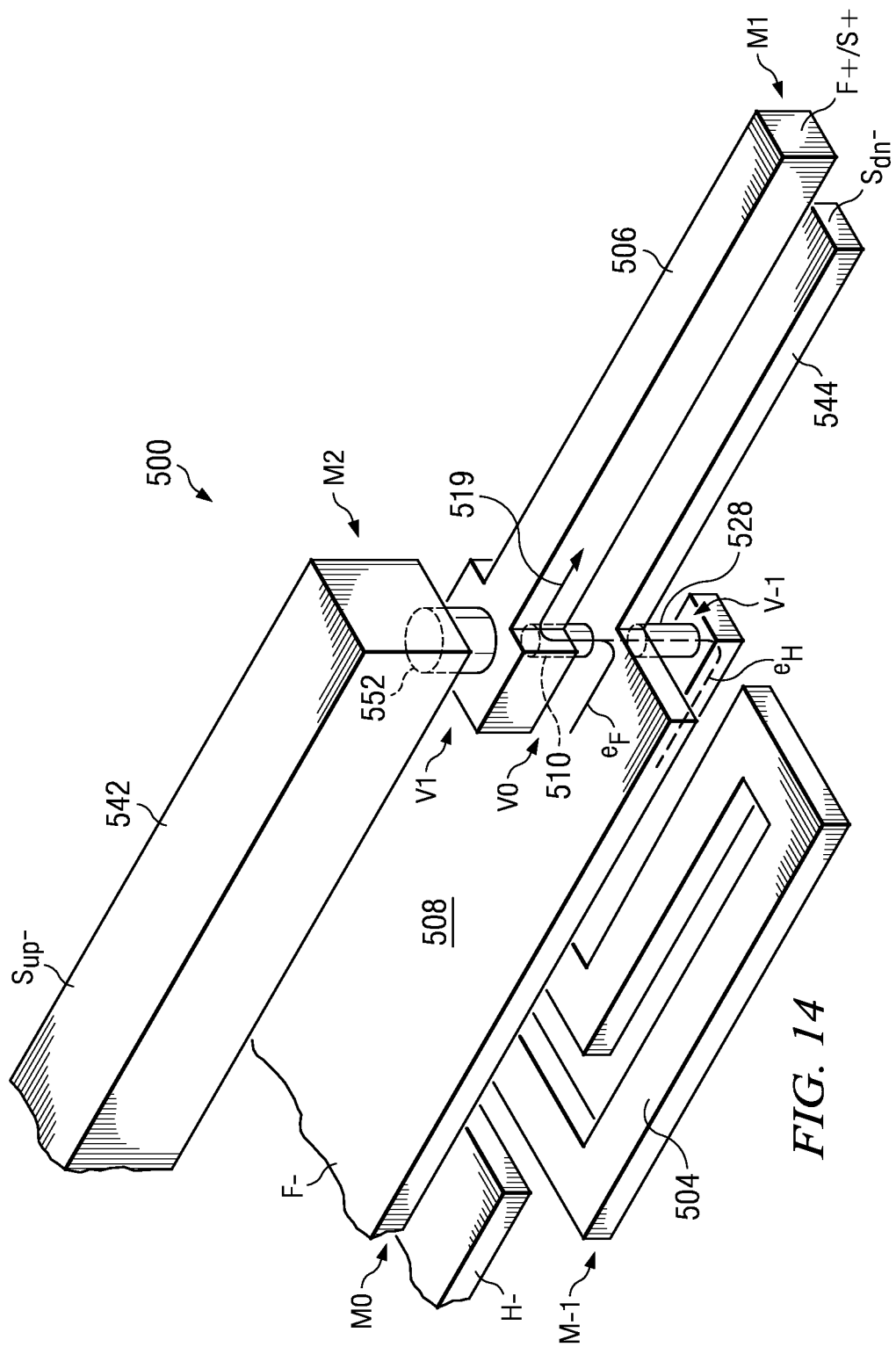

FIG. 14 illustrates a perspective view of a test structure 500 comprising an upstream configuration. Feed line 508 is formed in conductive layer M0 and includes a wide plate that functions as a heat collector for assisting in absorbing temperature changes caused by the temperature adjuster 504 in conductive layer M-1. Temperature adjuster 504 is formed in conductive layer M-1 beneath the feed line 508 and is coupled to the feed line 508 by a via 528 formed in conductive layer V-1.

Current $e_H$ is generated by a signal H− applied to the temperature adjuster 504. Current $e_H$ contributes to a portion of the current 519 through the stress line 506 in this embodiment. The other portion of the current 519 comprises current $e_F$ through the feed line 508 which is generated by signal F− applied to the feed line 508. The return F+ and sense line S+ reside on the opposite end of the stress line 506 from the signals H− and F−. Sense line 542 for signal $S_{up-}$ in conductive layer M2 provides access to the top of the via 510 through via 552 in conductive layer V1 and a portion of the stress line 506. Sense line 544 for signal $S_{dn-}$ in conductive layer M1 provides access to the bottom of via 510. Sense lines 542 and 544 also provide cooling or temperature dissipation of temperature changes caused by the temperature adjuster 504, for example.

Figure 15:
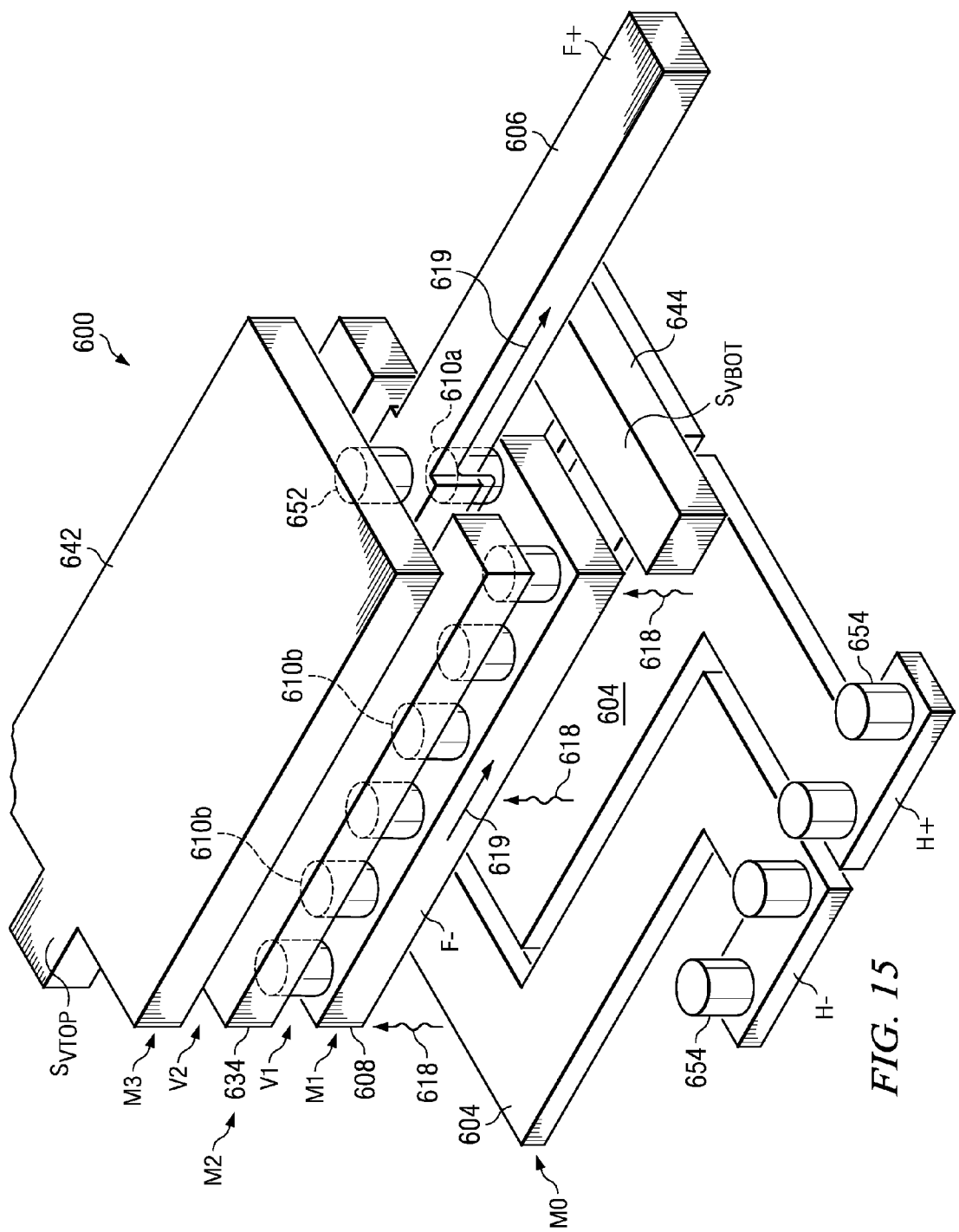

FIG. 15 shows a test structure 600 comprising an upstream configuration wherein the feed line 608 in conductive layer M1 includes a wide metal plate that functions as a heat collector for dissipating temperature changes caused by the temperature adjuster 604. A heat collector 634 is disposed over the feed line 608 and is coupled at a plurality of locations to the feed line 608 by vias 610b in conductive layer V1. Sense line 642 for signal $S_{VTOP}$ comprises a widened metal plate region that functions as a heat collector adapted to facilitate in the dissipation of temperature changes from the underlying temperature adjuster 604, feed line 608, and heat collector 634 in this embodiment. The feed line 608 provides all of the current 619 for the electromigration tests through the via 610a and the stress line 606 in this embodiment.

Figure 16:
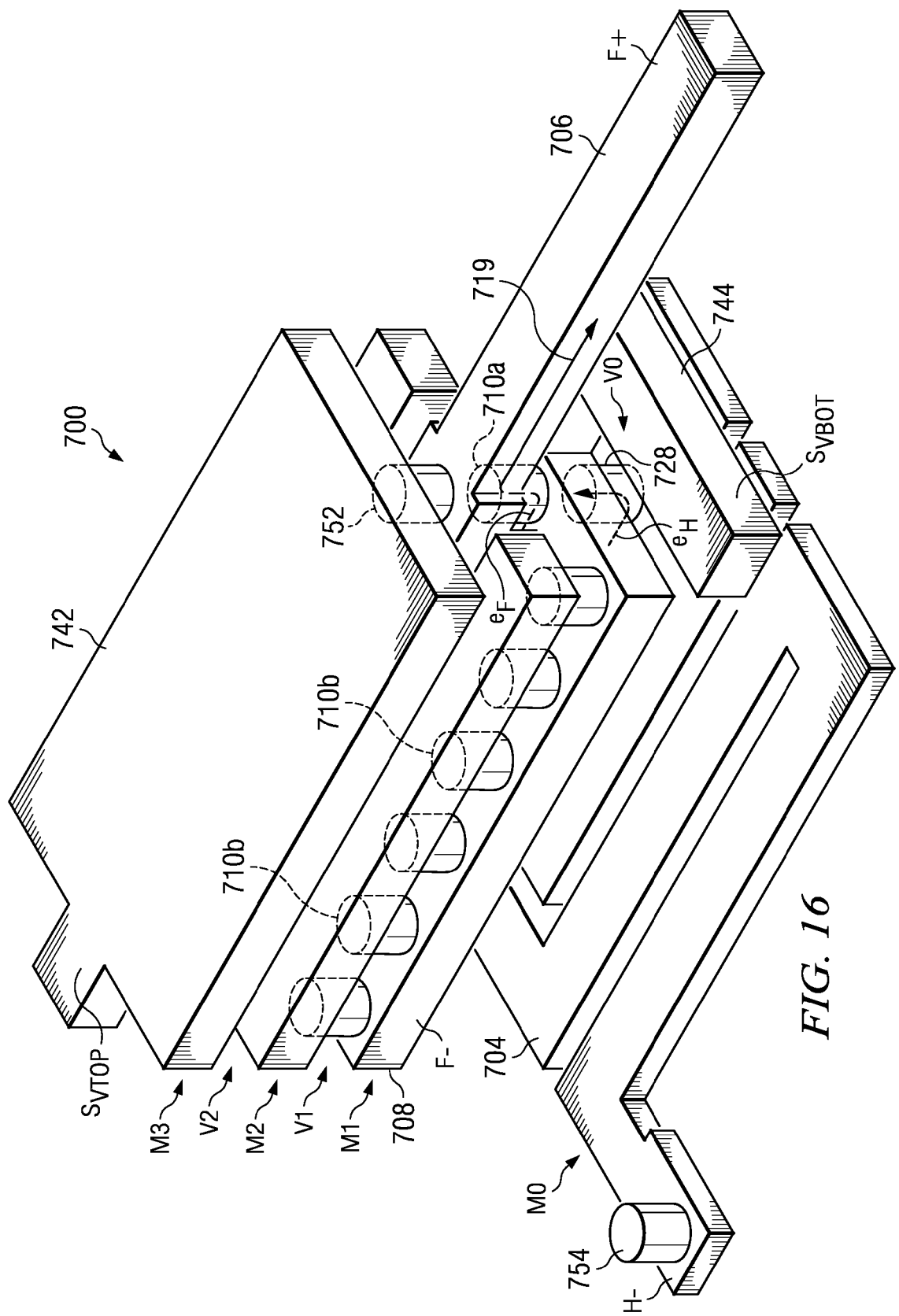

FIG. 16 shows yet another test structure 700 having an upstream configuration in accordance with an embodiment of the present invention. This embodiment is similar to the embodiment shown in FIG. 15, yet the temperature adjuster 704 contributes to a portion $e_H$ of the current 719 during electromigration tests. The temperature adjuster 704 is coupled to the via 710a by a via 728 formed in conductive layer V0, and also by the feed line 708, for example.

Figure 17:
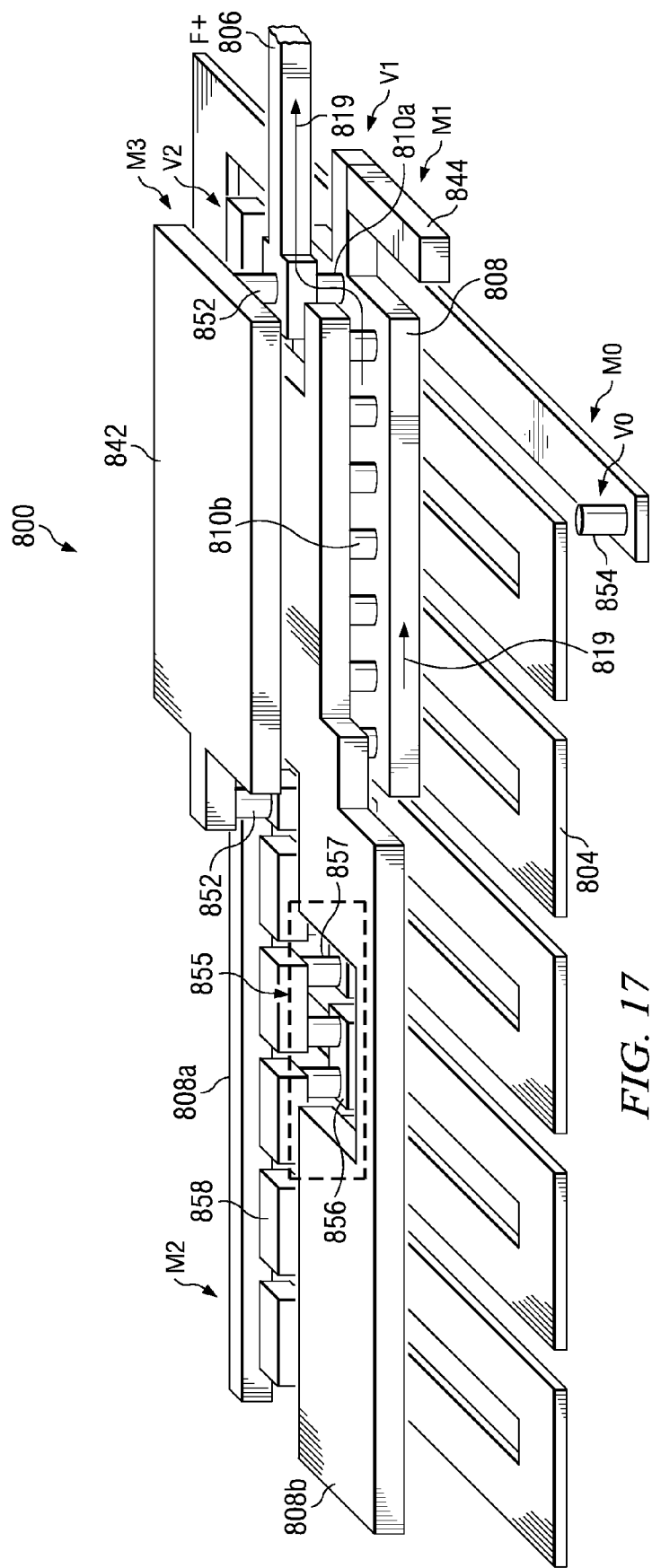
FIG. 17 shows a perspective view of an embodiment of the present invention that includes a thermal coefficient of resistance (TCR) determination test structure proximate the feed line of the test structure.

FIG. 17 shows another preferred embodiment of the present invention comprising a similar configuration as the test structure 700 shown in FIG. 16. The test structure 800 shown in FIG. 17 includes three additional features proximate the feed line 808 region: at least one wide conductive line 808b, at least one narrow conductive line 808a, and at least one via chain 856/857/858 formed in conductive layer V1. The narrow line 808a preferentially has the same width as the stress line 806 and is preferably placed in the same M2 level that the stress line 806 is formed in. The narrow line 808a preferably comprises width that is less than or substantially equal to a width of the wide conductive line, for example. The via chain 856/857/858 preferentially has the same via 857 size as the stressed via 810a. These three features are homogeneously heated and/or cooled by the temperature adjuster 804. The narrow line 808a, the wide line 808b, the via chain 856/857/858 and the temperature adjuster 804 comprise a novel TCR determination test structure in accordance with embodiments of the present invention. The narrow line 808a and the via chain 856/857/858 are also referred to herein as TCR determinators, for example.

The wide line 808b is used as a TCR reference and also as a feed line, for example. The narrow line 808a comprising a TCR determinator may be used for M2 level narrow line TCR calibration (i.e., stress line 806 TCR calibration). The via chain 856/857/858 comprising a TCR determinator may be used for V1 level TCR calibration (i.e., stressed via 810a TCR calibration), for example.

In FIG. 17, the TCR determination test structure is shown disposed proximate the stressed via 810a of a test structure 800 comprising a feed line 808, stress line 806, and stressed via 810a as described herein for test structures 100, 200, 300, 400, 500, 600, and 700 shown in the previous figures. The wide line 808b comprises a wide conductive line that is disposed proximate and extends along a side of the feed line 808, and the wide line 808b is also proximate the stressed via 810a. Alternatively, the TCR determination test structure comprising the wide line 808b, the narrow line 808a, and the via chain 856/857/858 may be used separately as an independent test structure to determine the TCR of vias 857 in the via chain and/or to determine the TCR of narrow conductive lines such as stress line 806 in a conductive material layer, for example. In other embodiments, the TCR determination test structure may comprise a wide line 808b and a via chain 856/857/858 disposed proximate and extending along the sides of the stress line 806, not shown in the figures. Also not shown in FIG. 17 are optional dummy lines (as may be needed for lithography purposes) nested in-between the described wide line 808b, the narrow line 808a (or stress line 806) and the via chain 856/857/858. These dummy lines can also be used for extrusion monitoring and/or temperature uniformity improvement, for example.

Note that the wide line 808b is shown cut-away in region 855 for better visibility of the via chain 856/857/858 in layers M1, V1, and M2 in FIG. 17.

The wide line 808b may be placed in the same layer M2 as the stress line 806, although the wide line 808b may be formed in other material layers. The wide line 808b preferably comprise a width of roughly about 1 μm with an upper limit of about 2 μm for damascene techniques (in order to avoid CMP dishing) and a lower limit of about 0.3 μm (where size dependent electron scattering noticeably impacts the TCR), for example, although alternatively, the wide line 808b may comprise other dimensions. More preferably, the wide line 808b comprises a width of about 2 μm or less, for example, in some embodiments. The wide line 808b preferably comprises a conductive line having a greater width than, or a width substantially equal to, the width of a portion of the TCR determinator, for example, the narrow line 808a. The wide line 808b may comprise a conductive line having a greater width than the widths of the vias 857 or the links 856 and 858 in the via chain 856/857/858, for example.

The narrow line 808a may be placed in the same layer M2 as the stress line 806, although the narrow line 808a may be formed in other material layers. The narrow line 808a preferably comprises an identical width as the width of the stress line 806 in some embodiments, for example, although alternatively, the narrow line 808a may comprise other dimensions. A narrow line 808a having identical material layer M2 and width as the stress line 806 advantageously enables the novel TCR determination test structure to be used to determine the TCR of the stress line 806. However, if the stress line 806 is selected to be wider than the wide line 808b, the TCR determination for the narrow line 808a may still be beneficial for process TCR monitoring (see below).

The via chain 856/857/858 comprises a plurality of vias 857 having substantially the same size as the stressed via 810a, in the embodiment shown. The vias 857 of the via chain 856/857/858 are preferably formed in the same material layer V1 that the stressed vias 810a are formed in, for example. This enables the novel TCR determination test structure to be used to determine the TCR of the stressed vias 857.

The vias 857 are coupled together by conductive lines or a plurality of links 856 and 858 formed in the M1 and M2 layers below and above the vias 857, respectively, as shown, in a chain formation. A plurality of first links 856 in the M1 layer disposed below the vias 857 couples together every other two adjacent vias 857, and a plurality of second links 858 in the M2 layer disposed above the vias 857 couples together every other two adjacent vias 857 staggered over by one via 857 from the first links 856 in the M1 layer, creating a serpentine-like electrical connection or via chain 856/857/858 in layers M1, V1, and M2, as shown.

The via chain 856/857/858 and the narrow line 808a are preferably placed close to or proximate the wide line 808b in order to assure temperature identity for the wide line 808b, the narrow line 808a, and the via chain 856/857/858, e.g., in the case of heating from a wafer-external heater or a temperature adjuster 804 disposed proximate the novel TCR determination test structure comprised of the wide line 808b, the narrow line 808a, and the via chain 856/857/858 as shown in FIG. 17, for example. A temperature of the plurality of vias 857 is substantially the same as a temperature of the narrow conductive line 808a, and is also substantially the same as a temperature of the wide conductive line 808b, due to the proximity of the wide conductive line 808b to the plurality of vias and to the narrow line 808a. Identical values for the via, narrow line, and wide line temperatures are also a consequence of the greater width and length of the temperature adjuster 804 compared to the heated structures (namely, vias 857, narrow line 808a, and wide line 808b). Additionally, heat collectors disposed above and/or below the heated structures may improve temperature identity for the via, narrow line, and wide line temperatures.

For example, the relationship between the resistance and temperature of a conductive material such as the wide conductive line 808b may be determined using Equation 2 below: Eq.

$$R(T)=R(T_0)*(1+TCR_0*(T-T_0));\qquad\text{2}$$

wherein the resistance R(T) comprises a resistance at temperature T, $R(T_0)$ is the resistance of the material at an initial temperature $T_0$, and $TCR_0$ is the temperature coefficient of resistance for the initial temperature $T_0$. Typical values for the TCR of copper at room temperature are constant (about 0.004 l/Kelvin(K)) for conductive line widths and thicknesses of greater than about 300 nm, and approach zero for shrinking line dimensions towards zero. The reason for width-independent TCR values for wider and thicker lines having a width and thickness of greater than about 300 nm is the dominance of temperature dependent bulk resistivity, while size dependant, vastly temperature independent scattering effects dominate the narrow line regime.

Using Eq. 2, the temperature $T_w$ of the wide line 808b for a certain amount of temperature adjuster 804 current may be calculated using Equation 3:

$$T_w=(R_w(T_w)-R_w(T_0))/(R_w(T_0)*TCR_w)+T_0;\qquad\text{Eq. 3}$$

wherein $R_w(T_w)$ comprises a measured resistance at temperature $T_w$ of the wide line 808b, and wherein $R_w(T_0)$ comprises a previously measured resistance at the temperature $T_0$ of the wide line 808b. The $TCR_w$ for the wide lines such as the wide line 808b (width regime where bulk scattering dominates) still depends on conductor and liner materials or anneal post-CMP temperature in the damascene technique, for example, but is quite well defined for a particular metallization technology. This low process variation sensitivity makes the wide line 808b an ideal candidate for $T_w$ determination (rather than using a narrower line), in particular where the somewhat more precise TCR determination at two known temperatures cannot be performed because of test time and/or capacity constraints, which is typically the case for fast in-line monitoring electromigration tests at the wafer level, for example. However, in some embodiments of the present invention, the wide line 808b may comprise a line having substantially the same width as the narrow line 808a, for example.

Thus, in accordance with embodiments of the present invention, having determined $T_w$ and also knowing that the temperatures $T_n$ at the narrow line 808a and temperature $T_v$ at the via chain 856/857/858 (or at the stressed via 810a) are the same as the $T_w$ determined, the TCRs for the narrow line 808a, $TCR_n$, and for the via chain 856/857/858 (or stressed via 810a), $TCR_v$, may be calculated or determined using Equations 4 and 5, respectively:

$$TCR_n=(R_n(T_n)-R_n(T_0))/(R_n(T_0)*(T_n-T_0));\text{ and}\qquad\text{Eq. 4}$$

$$TCR_v=(R_v(T_v)-R_v(T_0))/(R_v(T_0)*(T_v-T_0));\qquad\text{Eq. 5}$$

wherein $R_n$ is a measured resistance of the narrow line 808a, and $R_v$ is a measured resistance of the via 857 or 810a.

To summarize the series of measurements and calculations in accordance with a preferred embodiment of the present invention using the TCR determination test structure shown in FIG. 17, first, at an initial, known temperature $T_0$ such as an ambient temperature, as an example, measurements of the resistance $R_w(T_0)$ of the wide line 808b, the resistance $R_v(T_0)$ of the via chain 856/857/858, and the resistance $R_n(T_0)$ of the narrow line 808a at the initial temperature $T_0$ are taken. Second, a current is applied to the temperature adjuster 804 so that the temperature adjustor 804 temperature varies, e.g., heats or cools, to an unknown temperature, which changes the temperature of the wide line 808b to be an unknown altered temperature $T_w$. Third, measurements of the resistance $R_w(T_w)$ of the wide line 808b, the resistance $R_v(T_v)$ of the via chain 856/857/858, and the resistance $R_n(T_n)$ of the narrow line 808a at the altered temperature $T_w$ are taken. Fourth, the temperature $T_w$ of the wide line 808b is calculated using the assumed $TCR_w$, the measured resistances of the wide line 808b $R_w(T_w)$ and $R_w(T_0)$, and the known value of the initial temperature $T_0$, using Eq. 3 above. The temperatures $T_v$ and $T_n$ of the via chain 856/857/858 and the narrow line 808a are substantially equal to the temperature $T_w$, as previously described herein. Fifth, the amount of $TCR_n$ of the narrow line 808a is calculated using the measured values of the resistances of the narrow line 808a $R_n(T_n)$ and $R_n(T_0)$, the calculated value of $T_n$ which is equal to $T_w$, and the known initial temperature $T_0$, using Eq. 4 above. Sixth, the amount of $TCR_v$ of the via chain 856/857/858 is calculated using the measured values of the resistances of the via chain 856/857/858 $R_v(T_v)$ and $R_v(T_0)$, the calculated value of $T_v$ which is equal to $T_w$, and the known initial temperature $T_0$, using Eq. 5 above.

Preferably a feedback loop such as feedback loop 114 shown in FIG. 1 is included in the TCR determination test structure, wherein the feedback loop 114 is coupled to the temperature adjuster 804. The amounts of $TCR_n$ and $TCR_v$ determined using Eq. 4 and 5 are then used in the feedback loop 114, for example. The amounts of $TCR_n$ and $TCR_v$ determined are later used to determine temperatures of portions of the test structure, e.g., to determine temperatures at the stressed via 810a and the stress line 806, later in electromigration tests.

Again, only one TCR determinator (e.g., a via chain 856/857/858, stressed via 810a, or narrow line 808a) may be included in the TCR determination test structure in some embodiments. A test method using such a test structure preferably comprises, first, providing the test structure including a TCR determinator, at least one wide conductive line 808b proximate the TCR determinator, and a temperature adjuster 804 proximate at least the at least one wide conductive line 808b. The test structure comprises a first temperature $T_0$. The test method may include measuring a first resistance of the at least one wide conductive line 808b at the first temperature $T_0$, measuring a second resistance of the TCR determinator at the first temperature $T_0$, altering the first temperature $T_0$ of at least the at least one wide conductive line 808b using the temperature adjuster 804 (or a wafer-external heat source) of the test structure to an unknown second temperature $T_w$, measuring a third resistance of the at least one wide conductive line 808b at the second temperature $T_w$. The second temperature $T_w$ of the at least one wide conductive line 808b is determined using the measured third resistance of the at least one wide conductive line 808b at the second temperature $T_w$, an assumed first amount of $TCR_w$ for the at least one wide conductive line 808b, the measured first resistance of the at least one wide conductive line 808b at the first temperature $T_0$, and the first temperature $T_0$, e.g., using Eq. 3. A third temperature $T_{td}$ of the TCR determinator is then assumed to be substantially equal to the second temperature $T_w$ of the at least one wide conductive line 808b, as previously described herein. Equation 6 (which is the same as Eq. 4 and 5 above, with different variables) may be used to determine the $TCR_{td}$ of the TCR determinator in these embodiments, for example:

$$TCR_{td}=(R_{td}(T_{td})-R_{td}(T_0))/(R_{td}(T_0)*(T_{td}-T_0));\qquad\text{Eq. 6}$$

wherein $R_{td}(T_0)$ comprises the measured first resistance of the TCR determinator at the first temperature $T_0$, and $R_{td}(T_{td})$ comprises a measured second resistance of the TCR determinator at the third temperature $T_{td}$. A plurality of TCR determinators may be included in the test structure proximate the at least one wide conductive line 808b and may be used to determine the TCR of various conductive portions of a semiconductor device, for example, such as conductive lines and vias.

Temperature independent electron scattering effects may be present in small features such as in the narrow line 808a as well as in the via chain 856/857/858, increasing resistivity and thus lowering the $TCR_n$ and $TCR_v$ of the narrow line 808a and the via chain 856/857/858, respectively, in comparison to $TCR_w$. Also, liner thickness (e.g., liners that may be used to form the conductive materials in the conductive material layers M0, V0, M1, V1, M2, V2, and M3) may have an effect, primarily on the $TCR_v$ of the vias 810a and 857. These small size and liner effects on the TCR are nicely reflected in the $TCR_n$ and $TCR_v$ results from Eq. 4 and Eq. 5, by using the TCR determination test structure of embodiments of the invention. Advantageously, the typically small deviations of the real $TCR_w$ from assumed values of TCR do not affect the temperature homogeneity (or intended difference) for the stressed via 810a and the stress line 806, because $TCR_n$ and $TCR_v$ will have the same small errors as $TCR_w$.

The temperature adjuster 804 may be used to alter the temperature of the conductive materials and portions of the test structure 800 above the temperature adjuster 804, or alternatively, heating external to the wafer may be applied. A wafer/die-external heater may be used for rapid heating in some embodiments, wherein the resulting temperatures $T_w$, $T_n$, $T_v$, and $T_{td}$ are not known, e.g., as in by the use of the temperature adjuster 804. According to Eq. 4 and Eq. 5, the TCRs of the narrow line 808a and vias 810a or 857 may be determined at two temperatures by measuring the voltage across the narrow line 808a and across the via chain 856/857/858 or stressed via 810a, e.g., by applying a measurement current at either end of the narrow line 808a and the via chain 856/857/858 or the stressed via 810a. The resistance of the narrow lines 808a and the via chain 856/857/858 or stressed via 810a may be determined using Ohm's law, e.g., using the measured amount of voltage and current across and through the narrow line 808a and the via chain 856/857/858 or the stressed via 810a. For example, the resistance of a conductive line increases as the temperature increases, and the resistance decreases as the temperature decreases.

After having determined $TCR_n$ and $TCR_v$ the temperatures for the narrow line 808a and the via chain 856/857/858 or the stressed via 810a can be calculated applying Eq. 3, respectively.

Another advantage of the TCR determination test structure of embodiments of the present invention is that unusual TCR results for the narrow line 808a, vias 857, stressed via 810a, or stress line 806 may give some information on the quality of the processing techniques used to form the narrow line 808a, vias 857, stressed via 810a, or the stress line 806, and may be used as a rough quality check for via or narrow metal lines during inline wafer monitoring, for example. The TCR measurements of the narrow line 808a, vias 810a or 857, and/or the stress line 806 may be an indicator of electromigration or stress voiding performance, for example.

The TCR of narrow lines, vias, and contacts may vary from wafer to wafer and also within a single wafer. The novel TCR determination test structures of embodiments of the invention may be formed in each metal and via layer so that TCR measurements may be made in each metal and via layer, in conjunction with electromigration test structures as described in the previous embodiments of the invention, or the novel TCR determination test structures may be used with other types of electromigration structures. Alternatively, the novel TCR determination test structures may be used as stand-alone TCR determination test structures, for example.

The length of the wide line 808b is preferably sufficient to precisely measure the TCR effect in the test structure 800. For example, the wide line 808b preferably has a resistance of greater than about 2 Ohms, and thus preferably comprises a length of about 20 μm or greater in some applications. The lengths of the narrow line 808a and the via chain 856/857/858 may be shorter due to a higher per-length resistance of the narrow line 808a and the via chain 856/857/858, for example. After the TCR reference measurements are finished, the wide line 808b may also function as a feed line 808b coupled to the feed line 808 by vias 810b in the V1 layer, as shown in FIG. 17.

Note that FIG. 17 does not show the complete length of the wide line 808b; only a portion of the wide line 808b is shown. The complete lengths of the narrow line 808a and the via chain 856/857/858 are also not shown. Also, sense and supply current lines are needed and are preferably included in the test structure, as shown in and described with respect to FIGS. 11 through 16 for a precise four-point-measurement, which are also not shown in FIG. 17.

In another embodiment, the TCR of the stressed via 810a can directly be determined using the test structure 800, if a sufficiently wide and long area underneath the stressed via 810a and the wide line 808b is homogeneously heated, so that the stressed via 810a and the wide line 808b have identical temperatures. The stressed via 810a comprises the TCR determinator in this embodiment. In this embodiment, the temperature adjuster 804 is preferably larger than shown in FIG. 17, for example.

In yet another embodiment, the test structure 800 may be designed such that the wide line 808b, the narrow line 808a, and the via chain 856/857/858 are disposed adjacent and parallel to the stress line 806 (not shown herein), for example. Also, optional dummy lines (as may be needed for lithography purposes) may be nested in-between the wide line 808b, stress line 806, and the via chain 856/857/858, not shown in the drawings. These dummy lines can also be used for extrusion monitoring and/or temperature uniformity improvement, for example.

Note that in some embodiments, a TCR determination test structure may include at least one wide line 808b and either the via chain 856/857/858 or the narrow line 808a, but not both. However, in other embodiments, a TCR determination test structure preferably includes the wide line 808b and both the via chain 856/857/858 and the narrow line 808a, as shown in FIG. 17. In some embodiments, a TCR determination test structure may comprise two wide lines 808b, e.g., with a wide line 808b disposed on either side of a via chain 856/857/858, narrow line 808a, feed line 808, or stress line 806, not shown in the drawings.

The narrow line 808a shown in FIG. 17 may be replaced with another wide line comprising the same size and shape as the wide line 808b shown, for example. Or, a wide line may be disposed on a side of the narrow line 808a opposite the side of the narrow line 808a that the via chain 856/857/868 is disposed on, as another example. Or, the via chain 856/857/858 may be omitted and replaced with a narrow line in the position shown in FIG. 17 where the via chain 856/857/858 is shown, and an optional wide line may be disposed on a side of the narrow line opposite the side the other wide line 808b is disposed on, as yet another example.

The combination of TCR determination test structures and electromigration structures 100, 200, 300, 400, 500, 600, 700, and 800 of embodiments of the present invention is advantageous because the number of connection pads may be minimized, for example, because many connection pads of the test structures 100, 200, 300, 400, 500, 600, 700, and 800 may be used for multiple purposes in the embodiments described here. The various features and portions of the test structures 100, 200, 300, 400, 500, 600, 700, and 800 may also be formed in other material layers, e.g., layers M0, V0, M1, V1, M2, V2, and M3, than in the material layers described herein, for example.

Figure 18:
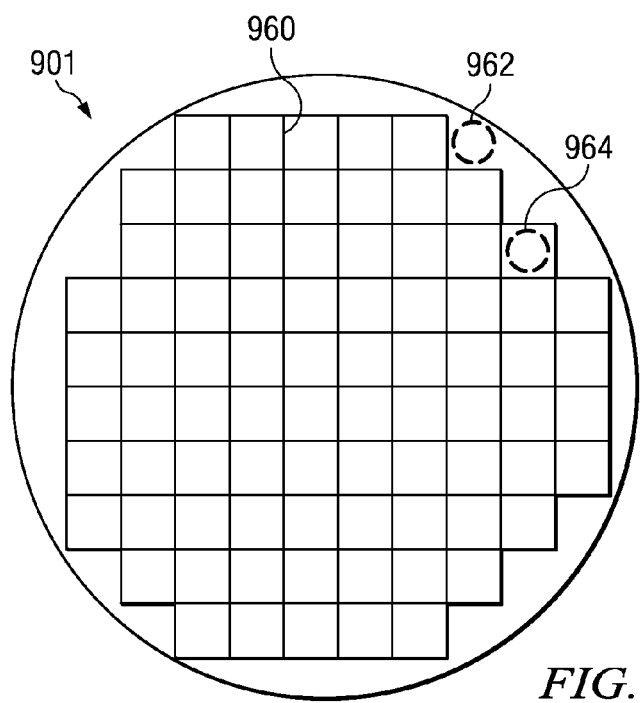
FIG. 18 is a top view of a semiconductor wafer, illustrating that the novel test structures of embodiments of the present invention may be formed in a scribe line region, a die region, or an incompletely formed die region of a semiconductor wafer.

FIG. 18 shows a top view of a semiconductor wafer 901, illustrating that the novel test structures 100, 200, 300, 400, 500, 600, 700, and 800 of embodiments of the present invention may be formed in a scribe line region 960, an incompletely formed die region 962, a die region 964 of a semiconductor wafer 901, or multiple regions and combinations thereof. The novel test structures 100, 200, 300, 400, 500, 600, 700, and 800 described herein may be located at scribe line regions 960 between individual die 964, wherein the die 964 comprise functional or test semiconductor devices, as examples. In this embodiment, the test structures 100, 200, 300, 400, 500, 600, 700, and 800 comprise sacrificial structures that are partially destroyed and/or discarded after the die 964 of the semiconductor wafer 901 are singulated. In other embodiments, the test structures 100, 200, 300, 400, 500, 600, 700, and 800 may be formed in the unused or incompletely formed or sized die regions 962 of the semiconductor wafer 901, and the test structures 100, 200, 300, 400, 500, 600, 700, and 800 may be discarded after electromigration tests are performed and the die 964 of the semiconductor wafer 901 are singulated, for example. In other embodiments, the test structures 100, 200, 300, 400, 500, 600, 700, and 800 may be formed in predetermined, dedicated die 964 regions, and the die 964 comprising the test structures 100, 200, 300, 400, 500, 600, 700, and 800 may or may not be discarded after singulation of the die 864, for example. The test structures 100, 200, 300, 400, 500, 600, 700, and 800 may also be formed in an unused region of a die 964, a test region of a die 964, multiple regions or combinations thereof with the other regions 960, 962, or 964 described herein, as examples.

Embodiments of the present invention also include semiconductor wafers 901 and semiconductor devices that include the novel test structures 100, 200, 300, 400, 500, 600, 700, and 800 described herein, for example. Embodiments of the present invention also include methods of processing and testing semiconductor devices using the novel test structures 100, 200, 300, 400, 500, 600, 700, and 800 and methods described herein. Embodiments of the present invention also include methods of manufacturing semiconductor devices including the test structures 100, 200, 300, 400, 500, 600, 700, and 800 described herein.

Advantages of embodiments of the present invention include providing novel test structures 100, 200, 300, 400, 500, 600, 700, and 800 for performing electromigration tests on semiconductor devices. The test structures 100, 200, 300, 400, 500, 600, 700, and 800 have improved temperature uniformity and homogeneity across their length. Electromigration tests may be performed quickly and accurately using the test structures 100, 200, 300, 400, 500, 600, 700, and 800 described herein.

Temperature and electromigration tests using the novel test structures 100, 200, 300, 400, 500, 600, 700, and 800 of embodiments of the present invention may be performed during the technology development phase of semiconductor devices, e.g., to test and improve electromigration in conductive material layers of semiconductor devices. The test structures 100, 200, 300, 400, 500, 600, 700, and 800 may also be used for technology qualification tests. Alternatively, the electromigration tests may be performed occasionally or periodically during production (e.g., for production reliability monitoring), after a predetermined number of lots or wafers, or on each lot or wafer, as examples. The tests may comprise wafer-level or package-level tests, for example.

Advantages of embodiments of the present invention include providing test structures 100, 200, 300, 400, 500, 600, 700, and 800 and methods for quickly and accurately measuring the effects of electromigration of semiconductor devices. For example, electromigration tests using the novel test structures 100, 200, 300, 400, 500, 600, 700, and 800 enable the user to accelerate the tests, because the novel test structures 100, 200, 300, 400, 500, 600, 700, and 800 assure temperature homogeneity up to higher currents than conventional test structures. Precise wafer-level tests may be performed in a few seconds or minutes or less, e.g., in about 100 to 1,000 seconds or less, increasing throughput and providing a cost savings. Also, package-level tests may be accelerated from days to convenient tests times of or below one day using the novel test structures 100, 200, 300, 400, 500, 600, 700, and 800. The tests may be performed using high stress, e.g., high stress line temperature and high current. Including Joule's heating, the stress line and stressed via temperatures can reach temperatures of about 350 degrees C. for aluminum conductive structures and about 600 degrees C. for copper conductive structures, for example. The amount of current 119, 219, 319, 419, 519, 619, 719, or 819 used in the test structures 100, 200, 300, 400, 500, 600, 700, and 800 is a function of the width and thicknesses of the portions of the test structures 100, 200, 300, 400, 500, 600, 700, and 800 for example. Current densities on the order of about several tens of $A/cm^2$ or so may be used, although smaller current densities may also be used. The current density used may vary according to the ambient temperature the tests are performed in, for example. Reduced test times down to a few minutes can be reached, although smaller or higher test times may also be used. The test results are also more reliable, due to the uniform temperature profiles along the stressed vias and stress lines in the novel test structures 100, 200, 300, 400, 500, 600, 700, and 800 described herein.

Note that dummy conductive lines may be included in the structures, not shown in the figures, wherein the dummy conductive lines are disposed proximate the feed lines, wide lines, stress lines, via chains, and/or sense lines. The dummy conductive lines are used for lithography purposes and/or heat dissipation and may be electrically inactive, for example. The dummy conductive lines may also be used for extrusion monitoring, wherein a resistance between the dummy conductive lines and the stress line is measured to detect shorts, which comprises another form of electromigration effect testing and measurement, for example. Alternatively, the various sense lines described herein may also comprise active conductive lines that may be shaped and positioned to improve heat dissipation, for example.

The test structures 100, 200, 300, 400, 500, 600, 700, and 800 have a uniform temperature profile at the stressed via and along the length of the stress lines, avoiding hot or cold spots at the via sites. The temperature profile across the length of the test structures 100, 200, 300, 400, 500, 600, 700, and 800 may be actively adjusted using the temperature adjusters 104, 204, 304, 404, 504, 604, 704, and 804 described herein.

Embodiments of the present invention may be implemented in many types of test structure configurations, using upstream and downstream current flow through stressed vias, for example. Optional heat collectors and widened regions of feed lines and sense lines may be implemented in the test structures to provide thermal dissipation or collection and improve the electromigration test results.

Accelerated electromigration tests may be performed using the novel test structures 100, 200, 300, 400, 500, 600, 700, and 800 by increasing or decreasing the temperature of the stressed vias 110, 110a, 210, 310a, 410, 510, 610a, 710a, and 810a using the novel temperature adjusters 104, 204, 304, 404, 504, 604, 704, and 804 described herein. Electromigration tests may be performed wherein the temperature of the stressed vias 110, 110a, 210, 310a, 410, 510, 610a, 710a, and 810a is intentionally caused to be raised or lowered initially, using the novel temperature adjusters 104, 204, 304, 404, 504, 604, 704 and 804 of the test structures 100, 200, 300, 400, 500, 600, 700, and 800 of embodiments of the present invention. The temperature adjusters 104, 204, 304, 404, 504, 604, 704 and 804 comprise compensation heaters and/or compensation coolers for the test structures 100, 200, 300, 400, 500, 600, 700, and 800, for example.

Advantageously, the temperature of the stressed vias 110, 110a, 210, 310a, 410, 510, 610a, 710a, and 810a and/or the stress lines 106, 206, 306, 406, 506, 606, 706, and 806 of the test structures 100, 200, 300, 400, 500, 600, 700, and 800 may be determined, by using the sense lines described herein. In some tests, for example, the goal may be to obtain the same temperature or a predetermined temperature difference in the stressed vias 110, 110a, 210, 310a, 410, 510, 610a, 710a, and 810a and the stress lines 106, 206, 306, 406, 506, 606, 706, and 806 of the test structures 100, 200, 300, 400, 500, 600, 700, and 800. Thus, the temperature of the stressed vias 110, 110a, 210, 310a, 410, 510, 610a, 710a, and 810a and the stress lines 106, 206, 306, 406, 506, 606, 706, and 806 may be obtained using the test structures 100, 200, 300, 400, 500, 600, 700, and 800, and the two temperatures may be compared, and the testing may be modified, e.g., by increasing or decreasing the current or test times, accordingly. Alternatively, the temperature of only the stressed vias 110, 110a, 210, 310a, 410, 510, 610a, 710a, and 810a or only the stress lines 106, 206, 306, 406, 506, 606, 706, and 806 of the novel test structures 100, 200, 300, 400, 500, 600, 700, and 800 may be measured, for example.

Furthermore, the novel temperature adjusters 104, 204, 304, 404, 504, 604, 704, and 804 may be used to control or equalize the temperature profile of the test structures 100, 200, 300, 400, 500, 600, 700, and 800 for a wide variety of process variations, without requiring electro-thermal simulations for the test structure 100, 200, 300, 400, 500, 600, 700, and 800 design. For example, wafer-to-wafer process variations or intra-wafer variations, such as dielectric thickness or composition variations, metal sheet resistance variations due to thickness, texture, or composition, and variations in the resistance of the stressed vias 110, 110a, 210, 310a, 410, 510, 610a, 710a, and 810a may be compensated for by varying the amount of current 119, 219, 319, 419, 519, 619, 719, and 819 and/or the amount of current through the temperature adjuster 104, 204, 304, 404, 504, 604, 704, and 804.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a first conductive line;
a second conductive line, wherein the second conductive line comprises a first end and a second end;
a conductive feature disposed between and coupled to the first conductive line and the second conductive line, wherein the conductive feature comprises a first end and a second end, the first end of the second conductive line being coupled to the first end of the conductive feature;
a first sense line coupled to the second end of the second conductive line;
a second sense line coupled to the first end of the second conductive line;
a third sense line coupled to the second end of the conductive feature;
a temperature adjuster proximate the conductive feature, wherein when a current is passed through the first conductive line, the conductive feature, and the second conductive line, temperature and/or electromigration in the second conductive line or at the conductive feature is measurable, wherein the temperature and/or electromigration in the second conductive line is measurable using the first sense line and the second sense line, wherein the temperature and/or electromigration at the conductive feature is measurable using the second sense line and the third sense line; and
a feedback device coupled to the temperature adjuster and the conductive feature.

2. A semiconductor device comprising:
a first conductive line;
a second conductive line;
a conductive feature disposed between and coupled to the first conductive line and the second conductive line;
a temperature adjuster proximate the conductive feature, wherein when a current is passed through the first conductive line, the conductive feature, and the second conductive line, temperature and/or electromigration in the second conductive line or at the conductive feature is measurable;
a feedback device coupled to the temperature adjuster and the conductive feature; and
a thermal coefficient of resistance (TCR) determination test structure proximate the first conductive line, the second conductive line, the conductive feature, and/or the temperature adjuster, wherein the TCR determination test structure comprises a wide conductive line and a TCR determinator proximate the wide conductive line, the wide conductive line comprising a first width, the first width being greater than or substantially equal to a second width of a portion of the TCR determinator.

3. The semiconductor device according to claim 2, wherein a temperature and an amount of TCR of the TCR determinator are determinable from a determinable temperature of the wide conductive line.

4. The semiconductor device according to claim 3, wherein the TCR determinator comprises a via chain, the conductive feature, and/or a narrow conductive line, the narrow conductive line comprising the second width.

5. A semiconductor device comprising:
a feed line disposed over a workpiece;
a stress line disposed over the workpiece;
a conductive feature disposed between the feed line and the stress line;
a temperature adjuster disposed proximate the conductive feature, wherein the temperature adjuster is configured to actively heat and cool the conductive feature; and
a feedback device coupled to the temperature adjuster and the conductive feature, wherein the feedback device comprises a controller including an input and an output, a first temperature determinator, a second temperature determinator, and a signal summer, the first temperature determinator including a first input, a second input, and an output, the second temperature determinator including a first input, a second input, and an output, wherein the first input of the first temperature determinator is coupled to a first side of the conductive feature, wherein the second input of the first temperature determinator is coupled to a second side of the conductive feature, wherein the output of the first temperature determinator comprises a first signal indicating the temperature of the conductive feature, and wherein the first input of the second temperature determinator is coupled to a first side of the stress line.

6. The device of claim 5, wherein the second input of the second temperature determinator is coupled to a second side of the stress line, wherein the output of the second temperature determinator comprises a second signal indicating the temperature of the stress line.

7. The device of claim 6, wherein the output of the first temperature determinator, the output of the second temperature determinator, and an offset signal are coupled to a plurality of inputs of the signal summer, and wherein an output of the signal summer is coupled to the input of the controller.

8. The device of claim 5, wherein the temperature adjuster is coupled to the conductive feature.

9. The device of claim 5, wherein a current supply line is coupled to the feed line, and wherein a current return line is coupled to the stress line.

10. The device of claim 5, wherein the temperature adjuster comprises a heater, a Peltier element, and/or a thermoelectric device.

11. The device of claim 5, wherein the temperature adjuster comprises a semiconductor material or a refractory metal.

12. The device of claim 5, wherein the feedback device is adapted to monitor and control a temperature of the conductive feature.

13. The device of claim 5, wherein the input of the controller is coupled to a signal indicating an error between a temperature difference set value and an offset between a temperature of the conductive feature and a temperature of the stress line, and wherein the output of the controller is coupled to the temperature adjuster.

14. A semiconductor device comprising:
a feed line disposed over a workpiece;
a stress line disposed over the workpiece;
a conductive feature disposed between the feed line and the stress line, the conductive feature coupling the feed line with the stress line;
a heater disposed proximate the conductive feature; and
an input of a feedback device coupled to the conductive feature, and an output of the feedback device coupled to the heater, the feedback device configured to monitor and control a temperature of the conductive feature by controlling a heat output of the heater, wherein the heater is disposed in a first metallization layer, wherein the feed line is disposed in a second metallization layer, the second metallization layer being above the first metallization layer, wherein the stress line is disposed in a third metallization layer, the third metallization layer being above the second metallization layer, and wherein the conductive feature is disposed in a via level between the second and the third metallization layers.

15. The device of claim 14, wherein the heater is electrically coupled to the feed line.

16. The device of claim 14, wherein the heater is electrically coupled to the conductive feature from a bottom portion of the conductive feature.

17. The device of claim 14, further comprising a first heat collector disposed under the stress line, the first heat collector being coupled to the stress line.

18. The device of claim 17, further comprising a second heat collector disposed under the feed line, the second heat collector being coupled to the feed line.

19. The device of claim 18, wherein the second heat collector is disposed in a same metallization layer as the stress line.

20. The device of claim 14, wherein the heater is disposed perpendicular to the stress line.

21. A semiconductor device comprising:
a feed line disposed over a workpiece;
a stress line disposed over the workpiece;
a conductive feature disposed between the feed line and the stress line, the conductive feature coupling the feed line with the stress line;
a heater disposed proximate the conductive feature; and
an input of a feedback device coupled to the conductive feature, and an output of the feedback device coupled to the heater, the feedback device configured to monitor and control a temperature of the conductive feature by controlling a heat output of the heater, wherein the heater is disposed in a same metallization layer as the stress line and the feed line.

22. The device of claim 21, wherein the heater is disposed perpendicular to the stress line and the feed line.

23. A semiconductor device comprising:
a feed line disposed over a workpiece;
a stress line disposed over the workpiece;
a conductive feature disposed between the feed line and the stress line, the conductive feature coupling the feed line with the stress line;
a heater disposed proximate the conductive feature; and
an input of a feedback device coupled to the conductive feature, and an output of the feedback device coupled to the heater, the feedback device configured to monitor and control a temperature of the conductive feature by controlling a heat output of the heater, wherein the heater is disposed in a first metallization layer, wherein the stress line is disposed in a second metallization layer, the second metallization layer being above the first metallization layer, wherein the feed line is disposed in a third metallization layer, the third metallization layer being above the second metallization layer, and wherein the conductive feature is disposed in a via level between the second and the third metallization layers.

24. The device of claim 23, wherein the heater is electrically coupled to the conductive feature from a top portion of the conductive feature.

25. The device of claim 24, wherein the heater is coupled to the feed line through a via.

26. The device of claim 23, wherein the heater comprises a winding structure.

27. The device of claim 26, further comprising a heat collector disposed in a fourth metallization layer, the fourth metallization layer disposed between the first and the second metallization layers.

28. The device of claim 27, wherein a portion of the heat collector under the conductive feature is wider than the feed line.

29. The device of claim 26, further comprising a first heat collector disposed in the second metallization layer.

30. The device of claim 29, wherein the first heat collector is coupled to the feed line through a plurality of vias.

31. The device of claim 29, further comprising a second heat collector, wherein the second heat collector is coupled to the first heat collector through a plurality of vias.

32. The device of claim 29, wherein the heater is coupled to the stress line through a via.

33. A semiconductor device comprising:
a feed line disposed over a workpiece;
a stress line disposed over the workpiece;
a conductive feature disposed between the feed line and the stress line, the conductive feature coupling the feed line with the stress line;
a heater disposed proximate the conductive feature; and
an input of a feedback device coupled to the conductive feature, and an output of the feedback device coupled to the heater, the feedback device configured to monitor and control a temperature of the conductive feature by controlling a heat output of the heater, wherein the stress line is disposed in a first metallization layer, wherein the feed line is disposed in a second metallization layer, the second metallization layer being disposed above the first metallization layer, wherein the heater is disposed in a third metallization layer, the third metallization layer being above the second metallization layer, and wherein the conductive feature is disposed in a via level between the first and the second metallization layers.

34. The device of claim 33, wherein the heater is oriented perpendicular to the feed line and the stress line.

* * * * *